(12) United States Patent
Lukas et al.

(10) Patent No.: US 7,332,445 B2
(45) Date of Patent: Feb. 19, 2008

(54) POROUS LOW DIELECTRIC CONSTANT COMPOSITIONS AND METHODS FOR MAKING AND USING SAME

(75) Inventors: Aaron Scott Lukas, Washington, DC (US); Mark Leonard O'Neill, Allentown, PA (US); Eugene Joseph Karwacki, Jr., Orefield, PA (US); Raymond Nicholas Vrtis, Orefield, PA (US); Jean Louise Vincent, Bethlehem, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 82 days.

(21) Appl. No.: 11/228,223

(22) Filed: Sep. 19, 2005

(65) Prior Publication Data

US 2006/0078676 A1    Apr. 13, 2006

Related U.S. Application Data

(60) Provisional application No. 60/613,937, filed on Sep. 28, 2004.

(51) Int. Cl.
*H01L 21/31* (2006.01)
(52) U.S. Cl. .................. 438/780; 438/781; 427/568; 427/588; 428/447
(58) Field of Classification Search ............... 438/780, 438/781, 784; 427/255.27, 568, 588; 428/447
See application file for complete search history.

(56) References Cited

U.S. PATENT DOCUMENTS 4,105,821 A    8/1978    Blaich et al.
5,296,624 A    3/1994    Larson et al.
6,054,206 A    4/2000    Mountsier (Continued)

FOREIGN PATENT DOCUMENTS

EP    023239 A2    2/1981

(Continued)

OTHER PUBLICATIONS

A. Grill, et al., "Novel Low-k Dual-phase Materials Prepared by PECVD," Mat. Res. Soc. Symp. Proc. vol. 612, 2000 Materials Research Society, Yorktown Heights, NY.

(Continued)

*Primary Examiner*—Hsien-Ming Lee
(74) *Attorney, Agent, or Firm*—Joseph D. Rossi

(57) ABSTRACT

A porous organosilicate glass (OSG) film: $Si_vO_wC_xH_yF_z$, where v+w+x+y+z=100%, v is 10 to 35 atomic %, w is 10 to 65 atomic %, x is 5 to 30 atomic %, y is 10 to 50 atomic % and z is 0 to 15 atomic %, has a silicate network with carbon bonds as methyl groups ($Si-CH_3$) and contains pores with diameter less than 3 nm equivalent spherical diameter and dielectric constant less than 2.7. A preliminary film is deposited by a chemical vapor deposition method from organosilane and/or organosiloxane precursors, and independent pore-forming precursors. Porogen precursors form pores within the preliminary film and are subsequently removed to provide the porous film. Compositions, film forming kits, include organosilane and/or organosiloxane compounds containing at least one Si—H bond and porogen precursors of hydrocarbons containing alcohol, ether, carbonyl, carboxylic acid, ester, nitro, primary amine, secondary amine, and/or tertiary amine functionality or combinations.

55 Claims, 6 Drawing Sheets

U.S. PATENT DOCUMENTS

| | | | |
|---|---|---|---|
| 6,068,884 | A | 5/2000 | Rose et al. |
| 6,171,945 | B1 | 1/2001 | Mandal et al. |
| 6,238,751 | B1 | 5/2001 | Mountsier |
| 6,312,793 | B1 | 11/2001 | Grill et al. |
| 6,583,048 | B1 | 6/2003 | Vincent et al. |
| 6,656,854 | B2 | 12/2003 | Miyano et al. |
| 2003/0232137 | A1* | 12/2003 | Vrtis et al. ............... 427/248.1 |
| 2004/0101633 | A1 | 5/2004 | Zheng et al. |
| 2004/0102006 | A1 | 5/2004 | Xu et al. |
| 2004/0156987 | A1 | 8/2004 | Yim et al. |
| 2005/0048795 | A1 | 3/2005 | Ko et al. |

FOREIGN PATENT DOCUMENTS

| | | |
|---|---|---|
| EP | 1 037 275 | 9/2000 |
| EP | 1 077 477 A1 | 2/2001 |
| EP | 1 119 035 | 7/2001 |
| EP | 1176226 A1 | 1/2002 |
| EP | 1195451 A1 | 4/2002 |
| EP | 1201785 A1 | 5/2002 |
| EP | 1354980 A1 | 10/2003 |
| EP | 1 482 550 | 12/2004 |
| EP | 1482070 A1 | 12/2004 |
| JP | 19900064931 | 3/1990 |
| TW | 540118 | 3/1990 |
| WO | WO 00/24050 | 4/2000 |
| WO | WO 01/29052 A1 | 4/2001 |
| WO | WO 02/11204 A1 | 2/2002 |
| WO | WO 02/43119 A2 | 5/2002 |
| WO | WO 2004/083495 | 9/2004 |
| WO | WO 2005/019303 | 3/2005 |

OTHER PUBLICATIONS

A. Grill, et al., "SiCOH Dielectrics: From Low-K to Ultralow-K by PECVD," Conference Proceedings ULSI XVII, 2002 Materials Research Society, Yorktown Heights, NY.

A. Grill, et al., "Low Dielectric Constant SiCOH Films as Potential Candidates for Interconnect Dielectrics," Mat. Res. Soc. Symp. Proc. vol. 565, 1999 Materials Research Society, Yorktown Heights, NY.

A. Grill, et al., "Ultralow-*k* dielectrics prepared by plasma-enhanced chemical vapor deposition," Applied Physics Letters, vol. 79, No. 6, 2001, Yorktown Heights, NY., pp. 803-805.

Dixit, Girish, et al., "Film Properties and Integration Performance of a Nano-Porous Carbon Doped Oxide", Applied Materials, Inc., Santa Clara, California, USA, International Interconnect Technology Conference, Jun. 2004.

* cited by examiner

POROUS LOW DIELECTRIC CONSTANT COMPOSITIONS AND METHODS FOR MAKING AND USING SAME

CROSS-REFERENCE TO RELATED APPLICATIONS

This application claims the benefit of U.S. Provisional Application No. 60/613,937, filed 28 Sep. 2004.

BACKGROUND OF THE INVENTION

Low dielectric constant materials produced by chemical vapor deposition (CVD) methods are typically used as insulating layers in electronic devices. The electronics industry uses dielectric materials as insulating layers between circuits and components of integrated circuits (IC) and associated electronic devices. Line dimensions are being reduced in order to increase the speed and device density of microelectronic devices (e.g. computer chips). As the line dimensions decrease, the insulating requirements for the interlayer dielectric (ILD) become more rigorous. Shrinking the spacing requires a lower dielectric constant to minimize the RC time constant, where R is the resistance of the conductive line and C is the capacitance of the insulating dielectric interlayer. C is inversely proportional to spacing and proportional to the dielectric constant (k) of the interlayer dielectric (ILD).

Conventional silica ($SiO_2$) CVD dielectric films produced from $SiH_4$ or TEOS ($Si(OCH_2CH_3)_4$, tetraethylorthosilicate) and $O_2$ have a dielectric constant, k, greater than 4.0. There are several ways in which industry has attempted to produce silica-based chemical vapor deposition (CVD) films with lower dielectric constants, the most successful being the doping of the insulating silicon oxide film with organic groups providing dielectric constants in the range of 2.7-3.5. This organosilicate (OSG) glass is typically deposited as a dense film (density~1.5 $g/cm^3$) from an silicon-containing precursor, such as an alkylsilane, alkoxysilane, and/or siloxane, in addition to an oxidant, such as $O_2$ or $N_2O$. As increasingly higher device densities and smaller device dimensions require dielectric constant or "k" values to drop below 2.7, the industry has turned to various porous materials for improved insulating properties. The addition of porosity to OSG where the void space has an inherent dielectric constant of 1.0 reduces the overall dielectric constant of the materials. Porous OSG materials are considered to be low k materials because its dielectric constant is less than that of the standard material traditionally used in the industry—undoped silica glass. These materials are typically formed by adding pore-forming species or porogen precursors as reagents during the deposition process and removing the porogen from as-deposited or preliminary materil to provide a porous material. Other materials properties such as mechanical hardness, elastic modulus, residual stress, thermal stability, and adhesion to a variety of substrates depend upon the chemical composition and structure of the porous material or film. Unfortunately, many of these film properties suffer deleterious effects when porosity is added to a film.

BRIEF SUMMARY OF THE INVENTION

A porous organosilicate glass (OSG) film consisting of a single phase of a material represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, wherein the film has pores and a dielectric constant of 2.7 or less, as described herein.

Also described herein is a chemical vapor deposition method for producing the porous organosilicate glass film comprising: providing a substrate within a processing chamber; introducing gaseous reagents comprising at least one precursor selected from the group consisting of an organosilane and an organosiloxane containing at least one Si—H bond and a porogen precursor; applying energy to the gaseous reagents in the processing chamber to induce reaction of the gaseous reagents and provide a preliminary film on the substrate wherein the preliminary film comprises the porogen, and removing at least a portion of the porogen from the preliminary film to provide the porous film comprising pores and a dielectric constant less than 2.7.

Also described herein are compositions comprising porogens and precursors for producing porous OSG films.

DETAILED DESCRIPTION OF THE INVENTION

Porous organosilicate materials and films and methods and mixtures for making same are described herein. Unlike porous inorganic $SiO_2$ materials, the porous OSG materials and films described herein may exhibit hydrophobicity because of the organic groups contained therein. The porous OSG materials may also exhibit a low dielectric constant, or a dielectric constant of 2.7 or less, while exhibiting sufficient mechanical hardness, elastic modulus, low residual stress, high thermal stability, and high adhesion to a variety of substrates that allows them to be suitable for a variety of applications. The porous OSG materials described herein may have a density of 1.5 g/ml or less, or 1.25 g/ml or less, or 1.0 g/ml or less. In certain embodiments, the porous OSG materials can be made into a thin film that exhibits a low dielectric constant, high mechanical properties, and relatively high thermal and chemical stability in a variety of environments (e.g., oxygen, aqueous, oxidizing, or reducing environments) relative to other porous OSG glass materials.

It is believed that some of these properties may be the result of the selective incorporation into the film of carbon, preferably predominantly in the form of organic carbon, —$CH_x$, where x is a number ranging from 1 to 3, or at least a portion of the organic carbon is in the form of —$CH_3$ attached to the silicate network as terminal methyl groups through Si—C bonds. In certain preferred embodiments, fifty (50%) or greater, or 75% or greater, or 90% or greater of the hydrogen contained within the OSG material described herein is bonded to carbon or, alternatively, the amount of terminal Si—H bonds in the final film is minimized. In certain embodiments, the material has at least 10 $SiCH_3$ bonds for every one Si—H bond, more preferably 50 Si—$CH_3$ bonds for every one Si—H bond, and most preferably 100 Si—$CH_3$ bonds for every one Si—H bond.

Figure 1:
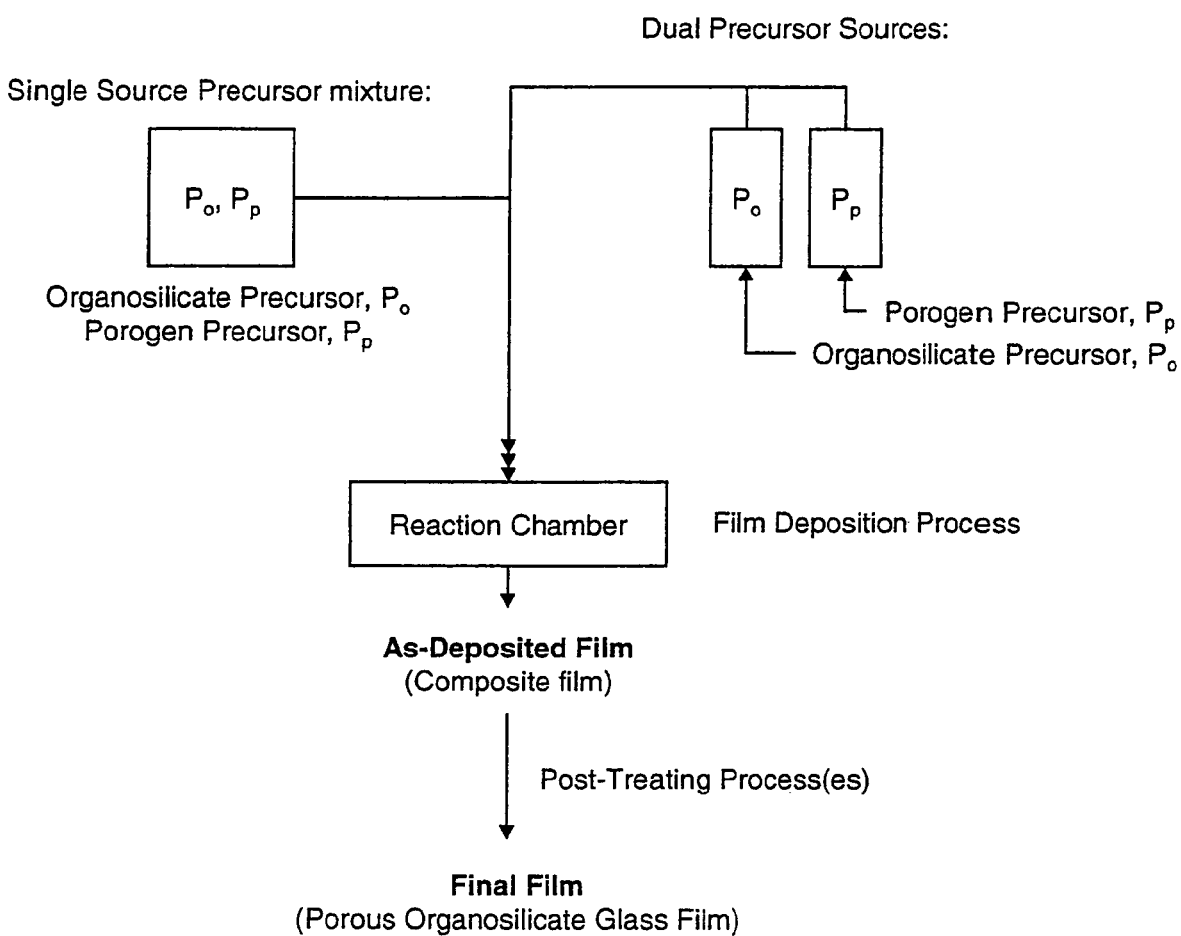
FIG. 1 provides a process flow chart of one embodiment of the process for forming a porous organosilicate glass material described herein.

FIG. 1 provides a process flow for one embodiment of the method disclosed herein for forming a porous OSG material film. The porous OSG material or film may be deposited from a mixture of reagents that comprises silicon-containing and porogen precursors. The "silicon-containing precursor" as used herein is a reagent that contains at least one Si atom such as, for example, an organosilane or an organosiloxane. A "porogen precursors", as used herein, is a reagent that is used to generate void volume within the resultant film. In the first step, a substrate is introduced into a processing chamber. During the deposition step, the silicon-containing and porogen precursors are introduced into the processing chamber and activated by one or more energy sources before and/or after introduction into the chamber. The precursors may co-deposit or co-polymerize onto at least a portion of a substrate surface to provide a preliminary film. In the next step, at least a portion of the porogen precursor can be removed from the preliminary film by the applying one or more energy sources such as, but not limited to, thermal, photo, electron, and combinations thereof, to the film. This treatment may be carried out at one or more pressures ranging from vacuum to ambient atmosphere, and under inert, oxidizing, or reducing conditions. The removal of at least a portion of the porogen results in the porous organosilicate material. In these embodiments, the degree of porosity and/or the dielectric constant of the resultant film may be affected by a variety of factors including, but not limited to, the ratio of silicon-containing precursor to porogen precursor within the mixture of precursors. In certain embodiments, further treatments may be conducted either during at least a portion or after film formation. These additional treatments may, for example, enhance certain properties such as mechanical strength, residual stress, and/or adhesion.

The phrase "chemical precursors" is used herein to describe the reagents comprising the "organosilicon precursor" and "porogen precursor", as well as any additional reagents desired for filming a film on a substrate, such as "carrier gas(es)", or other "additive gas(es)". Although the phrase "gaseous" is sometimes used herein to describe the precursors, the phrase is intended to encompass, without limitation, reagents delivered directly as a gas to the reactor, delivered as a vaporized liquid, a sublimed solid and/or transported by an inert carrier gas into the reactor.

In certain embodiments, the silicon-containing precursor and porogen precursor are chemically distinct from one another and are not linked by any covalent bonds. In these and other embodiments, the concentrations of the silicon-containing and porogen precursors can be controlled by distinct mass flow controllers and introduced into the reaction chamber from distinct supply sources and mixed within the chamber, mixed within a delivery line prior to entering the chamber, and/or mixed to provide a reaction mixture prior to entering the chamber. In the later embodiment, the silicon-containing and porogen precursors as well as other optional additives can be delivered a reaction mixture from a single supply source in which their concentrations in the reaction chamber are determined by the stoichiometry of the mixture, and the rate of flow into reaction chamber is controlled using a single mass flow controller. The chemical precursors can be delivered to the reactor system by any number of means, including but not limited to, using a pressurizable stainless steel vessel fitted with the proper valves and fittings to allow the delivery of liquid to the reaction chamber.

In other embodiments, a single species of molecule may function function as both the structure-former and porogen. That is, the structure-forming precursor and the pore-forming precursor are not necessarily different molecules, and in certain embodiments the porogen is a part of (e.g., covalently bound to) the structure-forming precursor. Precursors containing porogens bound to them are sometimes referred to hereinafter as "porogenated precursors". For example, it is possible to use neohexyl TMCTS as a single species, whereby the TMCTS portion of the molecule forms the base OSG structure and the bulky alkyl substituent neohexyl is the pore forming species which is removed during the anneal process. Having the porogen attached to a Si species that will network into the OSG structure may be advantageous in achieving a higher efficiency of incorporation of porogen into the film during the deposition process. Furthermore, it may also be advantageous to have two porogens attached to one Si in the precursor, such as in di-neohexyl-diethoxysilane, or two Si's attached to one porogen, such as in 1,4-bis(diethoxysilyl)cylcohexane, since the most likely bond to break in a plasma during the deposition process is the Si-Porogen bond. In this manner, reaction of one Si-Porogen bond in the plasma will still result in incorporation of the porogen in the deposited film. Additional non-limiting examples of preferred porogenated precursors include 1-neohexyl-1,3,5,7-tetramethylcyclotetrasiloxane, 1-neopentyl-1,3,5,7-tetramethylcyclotetrasiloxane, neopentyldiethoxysilane, neohexyldiethoxysilane, neohexyltriethoxysilane, neopentyltriethoxysilane and neopentyl-di-t-butoxysilane.

In certain embodiments of the materials in which a single or multiple porogen is attached to a silicon, it may be advantageous to design the porogen in such as way that when the film is cured to form the pores, a part of the porogen remains attached to the silicon to impart hydrophobicity to the film. The porogen in a precursor containing Si-Porogen may be chosen such that decomposition or curing leaves attached to the Si a terminal chemical group from the porogen, such as a —$CH_3$. For example, if the porogen neopentyl is chosen, it is expected that thermal annealing under the proper conditions would cause bond breakage at the C—C bonds beta to the Si, that is the bond between the secondary carbon adjacent to Si and the quaternary carbon of the t-butyl group will thermodynamically be the most favorable bond to break. Under proper conditions this would leave a terminal —$CH_3$ group to satisfy the Si, as well as provide hydrophobicity and a low dielectric constant to the film. Examples of precursors are neopentyl triethoxysilane, neopentyl diethoxy silane, and neopentyl diethoxymethylsilane In certain embodiments, the porous OSG film comprises: (a) about 10 to about 35 atomic % or about 20 to about 30% silicon; (b) about 10 to about 65 atomic %, or about 20 to about 45 atomic % oxygen; (c) about 10 to about 50 atomic or about 15 to about 40 atomic % hydrogen; (d) about 5 to about 30 atomic % or about 5 to about 20 atomic % carbon. Depending upon the precursors used, the OSG films described herein may also contain about 0.1 to about 15 atomic % or about 0.5 to about 7.0 atomic % fluorine, to improve one or more of materials properties. In these and other embodiments, the OSG film may also contain at least one of the following elements: fluorine, boron, nitrogen, and phosphorous.

Undoped silica glass produced by plasma enhanced (PE) CVD TEOS has an inherent free volume pore size determined by positron annihilation lifetime spectroscopy (PALS) analysis to be about 0.6 nm in equivalent spherical diameter. Dense OSG films produced by CVD of alkyl, alkoxy, and/or sil(ox)ane precursors alone (in the absence of pore-forming porogen precursors) have an inherent free volume pore size determined by PALS analysis to be about 0.7-0.9 nm in equivalent spherical diameter.

Porosity of the as-deposited films has an inherent free volume pore size determined by positron annihilation lifetime spectroscopy (PALS) analysis comparable to undoped silicate glass and dense organosilicate glass (about 0.6-0.9 nm) in equivalent spherical diameter. In some cases the pore-size-of-the-as-deposited films could be even smaller than that observed in undoped silicate glass or dense organosilicate glass because the presence of porogen in the films fills this void space. The pore size of the inventive films ("final films") as determined by small angle neutron scattering (SANS) or PALS is less than 3.0 nm in equivalent spherical diameter, or alternatively less than 2.0 nm in equivalent spherical diameter.

Total porosity of the final films may be from 5 to 75% depending upon the process conditions and the desired final film properties. Porous films described herein have a density of less than 1.5 g/ml, or alternatively, less than 1.25 g/ml or less than 1.00 g/ml. In certain embodiments, the OSG films described herein have a density at least 10% less than that of an analogous OSG film produced without porogens, or at least 20% less.

The porosity of the film need not be homogeneous throughout the film. In certain embodiments, there is a porosity gradient and/or multiple layers having varying degrees of porosity. Such films can be provided by, e.g. adjusting the ratio of porogen to precursor during deposition or by treating the film after deposition to induce the formation of a compositional or density gradient.

The porous OSG films described herein have a lower dielectric constant relative to dense OSG materials that do not have engineered porosity. In certain embodiments, the films described herein have a dielectric constant at least 15% less than that of an analogous OSG film produced without porogens, more preferably at least 25% less.

In certain embodiments, the porous OSG films described herein may have superior mechanical properties relative to common OSG materials. The mechanical hardness as determined by nanoindentation using standard MTS protocols is greater than 0.5 GPa, or alternatively greater than 1.0 GPa.

In certain embodiments, the porous OSG film may contain fluorine, in the form of inorganic fluorine (e.g. Si—F). Fluorine, when present, is present in an amount ranging from 0.5 to 7 atomic %.

The films are thermally stable. In particular, preferred films after anneal have an average weight loss of less than 1.0 wt %/hr isothermal at 425° C. under $N_2$. Moreover, the films preferably have an average weight loss of less than 1.0 wt %/hr isothermal at 425° C. under air.

The films exhibit good chemical resistance to a variety of chemical environments. Chemical resistance can be measured by changes in the dielectric constant or the appearance or disappearance of vibrational bands in the infrared spectrum, or changes in the composition of the film as measured by x-ray photoelectron spectroscopy (XPS). Typical chemical environments under which these films display their superior chemical stability are aqueous acidic or basic environments typically used in photoresist stripper formulations, oxidative plasma conditions typically used in plasma ashing, and other environments such as high humidity conditions (>85% relative humidity, >85° C.).

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N, TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film.

Thus in certain embodiments, the film is an insulation layer, an interlayer dielectric layer, an intermetal dielectric layer, a capping layer, a chemical-mechanical planarization or etch stop layer, a barrier layer or an adhesion layer in an integrated circuit.

With these properties the films are suitable for a variety of uses. The films are particularly suitable for deposition on a semiconductor substrate, and are particularly suitable for use as, e.g. an insulation layer, an interlayer dielectric layer and/or an intermetal dielectric layer. The films can form a conformal coating. The mechanical properties exhibited by these films make them particularly suitable for use in Al subtractive technology and Cu damascene or dual damascene technology.

Although the product of the method and mixture described herein are largely described herein as films, what is disclosed herein is not limited thereto. For example, porous OSG materials can be provided in any form capable of being deposited by CVD, such as coatings, multilaminar assemblies, and other types of objects that are not necessarily planar or thin, and a multitude of objects not necessarily used in integrated circuits. In certain preferred embodiments, the substrate is a semiconductor.

In addition to the porous OSG materials and films described herein, the process by which the products are made, methods of using the products and compounds and compositions useful for preparing the products are also described herein.

Compositions described herein can further comprise, e.g. at least one pressurizable vessel (preferably of stainless steel) fitted with the proper valves and fittings to allow the delivery of porogen precursor, silicon-containing precursor, and/or mixtures of porogen and silicon-containing precursors reaction chamber. The contents of the vessel(s) can be premixed. Alternatively, the porogen and silicon-containing precursors can be maintained in separate vessels or in a single vessel having separation means for maintaining the porogen and precursor separate during storage. Such vessels can also have means for mixing the porogen and precursor when desired.

In certain embodiments, the silicon-containing precursor can be comprised of a mixture of different organosilanes and/or organosiloxanes. It is also anticipated that the porogen precursor can be comprised of a mixture of different porogen precursors.

In certain embodiments, a chemical precursor or precursors in addition to the silicon-containing precursor and the porogen precursor can be delivered into the reaction chamber prior to, during, and/or after the film formation step. Such additional chemical precursors can include, e.g. inert gas(es) (e.g. He, Ar, $N_2$, Kr, Xe, etc.) and reactive substances such as gaseous, liquid, or volatile solid organic substances (e.g. $NH_3$, $H_2$, $CO_2$, CO, $H_2O$, $H_2O_2$, $O_2$, $O_3$, $CH_4$, $C_2H_2$, $C_2H_4$, etc.) that can be employed as a carrier gas, be employed in sub-stoichiometric, stoichiometric, or excess concentrations to promote modification of the film formation reactions, and hence the properties of the films, and/or can be used as post-treatment reagents to improve the properties or stability of the final film.

Those familiar with the art will recognize that helium is often used as a carrier gas for the facilitating the delivery of chemical precursors to the reaction chamber. It may be advantageous to employ a carrier gas that possesses an ionization energy that differs from than that of helium. This can lower the electron temperature in the plasma, which will change the film formation process and in turn change the structure and/or composition of the as-deposited film. Examples of gases with ionization energy lower than that of helium include $CO_2$, $NH_3$, CO, $CH_4$, Ne, Ar, Kr, and Xe.

The flow rate for each of the gaseous chemical precursors preferably ranges from 5 to 5000 sccm for a film formed on a single 200 mm wafer. The flow rates used for other reaction chambers may depend upon substrate size and reaction chamber configuration, and are in no way limited to 200 mm silicon wafers or reaction chambers that hold single substrates. In certain embodiments, the flow rates for the organosilicon and porogen precursors are selected to provide the desired amounts of organosilicate and porogen in the as deposited film to provide a final film having a dielectric constant between ranging from about 1.1 to about 2.7.

Energy is applied to the chemical precursors to induce the reaction and to form the film on the substrate. Such energy can be provided by, e.g. thermal, plasma, pulsed plasma, microwave plasma, helicon plasma, high density plasma, inductively coupled plasma, and remote plasma methods. In certain embodiments, two frequencies of radiation can be used in the same plasma and can be used to modify the plasma characteristics at the substrate surface. Preferably, the film is formed by plasma enhanced chemical vapor deposition. In these embodiments, a capacitively coupled plasma may be generated at a frequency of 13.56 MHz. Plasma power may range from 0.02 to 7 watts/cm$^2$, or from 0.3 to 3 watts/cm$^2$, based upon a surface area of the substrate.

The pressure in the reaction chamber during deposition may range from 0.01 to 600 torr or from 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g. a 5 mm outermost edge of the substrate is not included in the statistical calculation of uniformity.

The as-deposited film is comprised of organosilicate and porogen. The total mass or volume of the film is such that the percent mass or volume of organosilicate plus the percent mass or volume of porogen, respectively, is equal to the total mass or volume of the as-deposited film.

Not to be bound by theory, the relative amounts of organosilicate and porogen in the as-deposited film might be influenced by one or more of the following parameters: the relative amounts of porogen precursor and silicon-containing precursor in the chemical precursor mixture, and the relative formation rates of organosilicate glass and porogen, respectively, on the substrate where the relative amount of organosilicate in the as-deposited film is a function of the amount of silicon-containing precursor in the precursor mixture and its relative formation rate of organosilicate on the substrate. Likewise, the amount of porogen in the as-deposited film might be a function of the amount of porogen precursor in the precursor mixture and its relative formation rate of porogen on the substrate. Thus, it is possible, through selection of organosilicon and porogen precursors to affect independently the respective amounts, compositions, and structures of organosilicate and porogen formed on a substrate during the film formation steps.

Porous OSG films having desirable mechanical properties are prepared from a mixture of chemical reagents or precursors that contains one or more silicon-containing precursors and a porogen precursor. The following are non-limiting examples of silicon-containing precursors suitable for use with a distinct porogen precursor. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R^1_n(OR^2)_p(O(O)CR^3)_{4-(n+p)}Si$, when n=2 or 3, the two or three $R^1$ groups need not be identical to each other or to $R^2$.

1) chemical structures represented by the formula $R^1_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_4$ linear or branched, saturated, singly or multiply unsaturated, cyclic, aromatic, partially or fully fluorinated hydrocarbon, n is 1 to 3 and p is 0 to 3, 2) chemical structures represented by the formula $R^1_n(OR^2)_p(O(O)CR^4)_{3-n-p}Si$—O—$SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, n+m≧1, n+p≦3 and m+q≦3, 3) chemical structures represented by the formula $R^1_n(OR^2)_p(O(O)CR^4)_{3-n-p}Si$—$SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, n+m≧1, n+p≦3 and m+q≦3, 4) chemical structures represented by the formula $R^1{}_n(OR^2)_p(O(O)CR^4)_{3-n-p}Si\text{—}R^7\text{—}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, $R^7$ is $C_2$ to $C_6$ linear or branched, saturated, singly or multiply unsaturated, cyclic, partially or fully fluorinated hydrocarbon, n is 0 to 3, m is 0 to 3, q is 0 to 3 and p is 0 to 3, and n+m≧1, and n+p≦3, and m+q≦3, 5) chemical structures represented by the formula $(R^1{}_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, and n+p≦4, 6) chemical structures represented by the formula $(R^1{}_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, and n+p≦4, 7) chemical structures represented by cyclic silazanes of the formula $(NR^1SiR^2R^3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8, 8) chemical structures represented by cyclic carbosilanes of the formula $(C(R^1R^2)Si(R^3R^4))_x$, where $R^1$ through $R^4$ are independently H, $C_1$ to $C_4$, linear or branched, saturated, singly or multiply unsaturated, cyclic, partially or fully fluorinated, and x may be any integer from 2 to 8, Although reference is made throughout the specification to siloxanes, carbosilanes, and silazanes as precursors and porogenated precursors, it should be understood that the method and film is not limited thereto, and that, for example, other siloxanes, such as trisiloxanes, tetrasiloxanes, and other linear siloxanes of even greater length, may be also used herein.

The above silicon-containing precursors may be mixed with porogen precursors and/or any other silicon-containing precursors within the above list, including different silicon-containing precursors within the class except where n and/or m are from 0 to 3. Examples: TEOS, triethoxysilane, di-tert-butoxysilane, silane, disilane, di-tert-butoxydiacetoxysilane, etc.

Such embodiments facilitate controlling the amount, structure, and composition of the organosilicate portion of the as-deposited film. These embodiments may also control the ratio of porogen to organosilicate in the as-deposited film, enhance one or more critical properties of the as-deposited and/or final film, or control the size of the porogen in the as-deposited film or size of the pores in the final film, control the distribution of porogen in the as-deposited film or the distribution of pores in the final film, and/or control the pore connectivity in the final film. For example, a film formed by the reaction of diethoxymethylsilane (DEMS) and a porogen precursor might benefit from the use of an additional silicon-containing precursor, such as TEOS to reduce the amount of terminal groups attached to the organosilicate portion of the film, thereby increasing the density of silicate in the as-deposited and final porous films, and improving one or more desirable film properties, i.e., mechanical strength, or lower tensile stress, of the as-deposited and final films. A further example would be a film formed by the reaction of di-tert-butoxymethylsilane and porogen precursor that might benefit likewise from the addition of di-tert-butoxy-diacetoxysilane to the reaction chamber. Therefore, in certain embodiments, a mixture of a first silicon-containing precursor with two or fewer Si—O bonds with a second silicon-containing precursor with three or more Si—O bonds, is provided to tailor a chemical composition of the inventive film.

Not being bound by theory, the formation of engineered pores in an organosilicate glass film using a porogen whose size and shape may largely determine the size and shape of the pore that is formed upon its removal. Thus, the size, shape, connectivity, and amount of pores in the final film might be determined largely by the size, shape, connectivity, and amount of porogen in the as-deposited film. Therefore, the pore size, shape, connectivity, and amount of pores in a porous organosilicate material may be influenced by controlling the porogen precursor structure, composition, ratio of organosilicate precursor to the porogen precursor introduced to the reaction chamber, and the conditions used to form porogen on a substrate in a reaction chamber. Further, certain compositions and structures of porogen precursor may be advantageous for forming porogen in the as-deposited film that endows the final film with preferred properties.

The porogen in the as-deposited film may or may not be in the same form as the porogen precursor introduced to the reaction chamber. The porogen removal process liberates or removes substantially essentially all of the porogen or fragments of porogen from the film. The porogen precursor, the porogen in the as-deposited film, and the porogen being removed may or may not be the same species, although it is preferable that they all originate from the porogen precursor or mixture of porogen precursors. Regardless of whether or not the porogen composition changes throughout the inventive process, the term "porogen precursor" as used herein is intended to encompass all pore-forming reagents and derivatives thereof, in whatever forms they are found throughout the entire process described herein.

The composition of the porogen material in the as-deposited film is comprised of carbon and hydrogen and at least one of the elements selected from the following list: oxygen, nitrogen, fluorine, boron, and phosphorous.

The structure and composition of the porogen within the as-deposited film can be measured using a variety of analytical techniques. The porogen composition in the as-deposited film is largely comprised of carbon, which can be detected by a variety of techniques including x-ray photoelectron scattering (XPS) and Rutherford Back Scattering/Hydrogen Forward Scattering (RBS/HFS). The carbon content of an as-deposited film will be >10% higher or alternately >20% higher than that of a comparative film deposited without porogen precursor in the precursor mixture. The increased carbon content of an as-deposited film can also be measured using FT-IR by measuring the peak area in the region between 2600 and 3100 $cm^{-1}$ associated with the frequency of the C—H vibrational stretch. In the case of a largely hydrocarbon porogen species, the peak area in this region will be at least 100% greater or alternatively 200% greater than that of a comparative film deposited without porogen precursor in the precursor mixture.

In certain embodiments, at least a portion of or substantially all of porogen in the as-deposited film may be substantially removed during the post-treating step(s). The post-treating step(s) may also impact the chemical structure and/or composition of the porous organosilicate network that remains on the substrate to form the final porous film.

Gaseous, liquid, or solid chemicals may be judged desirable for use as porogen precursors based on a variety of criteria. For example, to form porogen on the substrate the porogen precursor should be volatile enough to be delivered into the reaction chamber. Once in the reaction chamber, the porogen precursor can undergo reactions in the gas or vapor phase, or alternatively on the surface of the substrate to become incorporated into the film as porogen. Methods that might be used to promote the formation of porogen from a porogen precursor include intramolecular reactions and/or intermolecular reactions including two-body collisions, three-body collisions, collisions with the sidewall, collisions with an inert gas, reaction with the meta-stable state of an inert gas, reaction with an oxidizing or reducing gas, reaction or collision with the silicate network forming precursor, reaction or collision with a reactive electron in the plasma, reaction or collision with a reactive neutral in the plasma, ionization, oxidation reactions, reduction reactions, collision with a ion in the plasma, photochemical reaction or rearrangement, thermally activated reaction or rearrangement, reaction with activated and/or neutral species on the substrate, or any other methods that could cause the porogen precursor to deposit on the substrate are considered viable ways to deposit porogen within the film. The porogen precursor might also undergo no reaction other than condensation on the substrate to be converted to porogen.

The structure and composition of the porogen precursor can contain functional groups that make it useful for the formation of porogen on the substrate. Examples of functional groups that might be included within the porogen precursor include: ether; epoxide; aldehyde; ketone; ketene; acetoxy; ester; acrylate; acrolein; acrylic acid; acrylonitrile; carboxylic acid; primary, secondary or tertiary amine; nitro; cyano; iso-cyano; amide; imide; anhydride; partially and/or perfluorinated groups; boronitride, boronic acid, borate; phosphyl, phospite, and/or phosphate and combinations thereof.

It is believed that the formation of porogen from the porogen precursor using plasma enhanced chemical vapor deposition techniques may depend on the electron collisional cross section of functional groups within the porogen precursor, which can induce secondary reactions that result in porogen formation. Therefore, in certain embodiments, elements, compositions, and/or structures such as other atomic species such as $O_2$, $N_2$, B, or Ph, might be desirable to enhance the rate of formation of porogen from the porogen precursor and the cure process.

Not to be bound by theory, it is possible that porogen formation from the porogen precursor may not significantly affect the formation of organosilicate from the organosilicon precursor, and that under certain conditions covalent bonding between the organosilicate film and porogen may be minimized. For example, a lack of covalent bonds between the porogen and organosilicate regions of the as-deposited film may make the porogen easier to remove from the as-deposited film using post-treatment steps, which may minimize the thermal budget requirements of post-treatment step(s). One of the primary constraints on semiconductor processing is thermal budget. The thermal budget for an individual process step consists of the time and temperature required to perform that step. In certain instances, it may be desirable that the thermal budget for any process step is minimized. Therefore processes that can be performed at low temperatures and/or short amounts of time are more desirable than analogous processes requiring high temperatures and/or long amounts of time. Therefore, the porogen precursors and silicon-containing precursors described herein form porous organosilicate films using certain process steps in which the thermal budget may be controlled or even minimized.

The porogen is removed from the as-deposited film by a post-treatment step, which can comprise thermal annealing under inert atmosphere, thermal annealing under vacuum, thermal annealing under oxidizing atmosphere, thermal annealing under reducing atmosphere, exposure to oxidizing and/or reducing chemical reagents, exposure to electron beam radiation, exposure to oxidizing plasma, exposure to reducing plasma, exposure to ultraviolet light under vacuum, exposure to ultraviolet light under inert atmosphere, exposure to ultraviolet light under oxidizing and/or reducing atmosphere, exposure to microwave radiation under vacuum, exposure to microwave radiation under inert atmosphere, exposure to microwave radiation under oxidizing and/or reducing atmosphere, exposure to radiation from a laser, exposure to the simultaneous application of any of the processes just listed, or exposure to any form of energy or chemical treatment that acts as an initiator to degrade the structure of and result in the removal of the porogen from the film. Other in-situ or post-deposition treatments may be used to enhance materials properties like hardness, stability (to shrinkage, to air exposure, to etching, to wet etching, etc.), integrability, uniformity and adhesion. Such treatments can be applied to the film prior to, during and/or after porogen removal using the same or different means used for porogen removal. Thus, the term "post-treating" as used herein typically denotes treating the film with energy (e.g. thermal, plasma, photon, electron, microwave, etc.) or chemicals to remove porogens and, optionally, to enhance materials properties.

The porogen precursor may be selected based on the incorporation of structure, composition, or functional groups that assist in the complete removal of porogen from the as-deposited film. For example, a porogen precursor that results in the incorporation of thermally sensitive, light sensitive or chemically sensitive functional groups in the porogen on the substrate may make it possible to efficiently employ thermal, light, or chemical reactions to remove the porogen from the film. Therefore, the use of porogen precursors that form porogen within an as-deposited film in which the porogen is capable of undergoing efficient and potentially complete removal by the activation of chemical groups or structures in the porogen.

The conditions under which post-treating are conducted can vary greatly. For example, post-treating can be conducted under high pressure, atmospheric pressure, or under a vacuum. The post-treating can also be conducted at high temperature (400-500° C.), cryogenic temperature (−100° C. and above), or at temperatures between these two points. The post-treating might also consist of a series of steps conducted under a combination of various pressure and/or temperatures.

Thermal annealing is conducted under the following conditions: the environment can be inert (e.g. nitrogen, $CO_2$, noble gases (He, Ar, Ne, Kr, Xe), etc.), oxidizing (e.g. oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 torr to about 1000 Torr, more preferably atmospheric pressure. However, a vacuum ambient is also possible for thermal annealing as well as any other post-treating means. The temperature is preferably 200-500° C., and the temperature ramp rate is from 0.1 to 100 deg ° C./min. The total annealing time is preferably from 0.01 min to 12 hours.

Chemical treatment of the OSG film is conducted under the following conditions: the use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

Supercritical fluid post-treatment for selective removal of porogens from an organosilicate film can be conducted under the following conditions: the fluid can be carbon dioxide, water, nitrous oxide, ethylene, $SF_6$, and/or other types of chemicals. Other chemicals can be added to the supercritical fluid to enhance the process. The chemicals can be inert (e.g. nitrogen, $CO_2$, noble gases (He, Ar, Ne, Kr, Xe), etc.), oxidizing (e.g. oxygen, ozone, nitrous oxide, etc.), or reducing (e.g. dilute or concentrated hydrocarbons, hydrogen, etc.). The temperature is preferably ambient to 500° C. The chemicals can also include larger chemical species such as surfactants. The total exposure time is preferably from 0.01 min to 12 hours.

Plasma treating for removal of porogen and possible chemical modification of the organosilicate is conducted under the following conditions: the environment can be inert (nitrogen, $CO_2$, noble gases (He, Ar, Ne, Kr, Xe), etc.), oxidizing (e.g. oxygen, air, dilute oxygen environments, enriched oxygen environments, ozone, nitrous oxide, etc.), or reducing (e.g. dilute or concentrated hydrogen, hydrocarbons (saturated, unsaturated, linear or branched, aromatics), etc.). The plasma power is preferably 0-5000 W. The temperature is preferably ambient to 500° C. The pressure is preferably 10 mtorr to atmospheric pressure. The total curing time is preferably 0.01 min to 12 hours. Wafer size and process dependant.

Photocuring for removal of porogen is conducted under the following conditions: the environment can be inert (e.g. nitrogen, $CO_2$, noble gases (He, Ar, Ne, Kr, Xe), etc.), oxidizing (e.g. oxygen, air, dilute oxygen environments, enriched oxygen environments, ozone, nitrous oxide, etc.), or reducing (e.g. dilute or concentrated hydrocarbons, hydrogen, etc.). The temperature is preferably ambient to 500° C. The power is preferably 0.1 to 5000 Watts per square inch. The wavelength is preferably IR, visible, UV or deep UV (wavelengths <200 nm). The total curing time is preferably 0.01 min to 12 hours.

Microwave post-treatment for removal of porogen is conducted under the following conditions: the environment can be inert (e.g. nitrogen, $CO_2$, noble gases (He, Ar, Ne, Kr, Xe), etc.), oxidizing (e.g. oxygen, air, dilute oxygen environments, enriched oxygen environments, ozone, nitrous oxide, etc.), or reducing (e.g. dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment for removal of porogen and/or improvement of film properties is conducted under the following conditions: the environment can be vacuum, inert (e.g. nitrogen, $CO_2$, noble gases (He, Ar, Ne, Kr, Xe), etc.), oxidizing (e.g. oxygen, air, dilute oxygen environments, enriched oxygen environments, ozone, nitrous oxide, etc.), or reducing (e.g. dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties.

The porosity of the film can be increased with the bulk density being correspondingly decreased to cause further reduction in the dielectric constant of the material and extending the applicability of this material to future generations (e.g. k<2.0).

In embodiments wherein substantially all of the porogen is removed, the removal of substantially all porogen is assumed if there is no statistically significant measured difference in the FT-IR absorption for the hydrocarbon region (aka. C-Hx, 2600-3100 $cm^{-1}$) between the post-treated porous organosilicate and the analogous organosilicate film formed in the reaction chamber without a porogen precursor present The following are non-limiting examples of materials suitable for use as porogen precursors:

1) Hydrocarbon structures containing one or more alcohol groups and having the general formula $C_nH_{2n+2-2x-2y-z}(OH)_z$ where n=1-12, and where x is the number of cyclic rings in the structure and is between 0 and 4, and where y is the number of unsaturated bonds in the structure and is between 0 and n, and where z is the number of alcohol groups in the compounds and is between 1 and 4, and where the alcohol functionality can be exo- and/or endocyclic. Examples: propanol (n=3, x=0, y=0, z=1), ethylene glycol (n=2, x=0, y=0, z=2), hexanol (n=6, x=0, y=0, z=1), cyclopentanol (n=5, x=1, y=0, z=1), 1,5-hexadiene-3,4-diol (n=6, x=0, y=2, z=2), cresol (n=7, x=1, y=3, z=1), and resorcinol (n=6, x=1, y=3, z=2), etc.

2) Hydrocarbon structures containing one or more ether groups and having the general formula $C_nH_{2n+2-2x-2y}O_z$ where n=1-12, and where x is the number of cyclic rings in the structure and is between 0 and 4, and where y is the number of unsaturated bonds in the structure and is between 0 and n, and where z is the number of ether linkages in the structure and is between 1 and 4, and where the ether linkage(s) can be exo- and/or endocyclic. Examples: diethylether (n=4, x=0, y=0, z=1), 2-methyl-tetrahydrofuran (n=5, x=1, y=0, z=1), 2,3-benzofuran (n=8, x=2, y=4, z=1), ethylene glycol divinyl ether (n=6, x=0, y=2, z=2), cineole (eucalyptol) (n=10, x=2, y=0, z=1), etc.

3) Hydrocarbon structures containing one or more epoxide groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of epoxide groups in the structure and is between 1 and 4, and where the epoxide groups can be attached to a cyclic ring or a linear chain. Examples: 1,2-epoxy-3-methylbutane (n=5, x=0, y=0, z=1), 1,2-epoxy-5-hexene (n=5, x=0, y=1, z=1), cyclohexene oxide (n=6, x=1, y=0, z=1), 9-oxabicyclo[6.1.0]non-4-ene (n=8, x=1, y=1, z=1), etc.

4) Hydrocarbon structures containing one or more aldehyde groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4. Examples: Cyclopentanecarboxaldehyde (n=5, x=1, y=0, z=1), etc.

5) Hydrocarbon structures containing one or more ketone groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4, and where the ketone group(s) can be exo- and/or endocyclic. Examples: 3,4-hexanedione (n=6, x=0, y=0, z=2), cyclopentanone (n=5, x=1, y=0, z=1), mesityloxide (n=6, x=0, y=1, z=1), etc.

6) Hydrocarbon structures containing one or more carboxylic acid groups and having the general formula $C_nH_{2n+2-2x-2y-3z}(OOH)_z$ where n=1-12, and where x is the number of cyclic rings in the structure and is between 0 and 4, and where y is the number of unsaturated bonds in the structure and is between 0 and n, and where z is the number of carboxylic acid groups in the structure and is between 1 and 4. Examples: cyclopentanecarboxylic acid (n=6, y=1, x=0, z=1), etc.

7) Hydrocarbon structures containing an even number of carboxylic acid groups and in which the acid functionality is dehydrated to form a cyclic anhydride group where the structures have the general formula $C_nH_{2n+2-2x-2y-6z}(O_3)_z$ where n=1-12, and where x is the number of cyclic rings in the structure and is between 0 and 4, and where y is the number of unsaturated bonds in the structure and is between 0 and n, and where z is the number of anhydride groups in the structure and is 1 or 2. Examples: maleic anhydride (n=2, x=0, y=1, z=1), etc.

8) Hydrocarbon structures containing an ester group with the general formula $C_nH_{2n+2-2x-2y-2z}(O_2)_z$ where n=1-12, and where x is the number of cyclic rings in the structure and is between 0 and 4, and where y is the number of unsaturated bonds in the structure, and where none of the unsaturated bonds are conjugated with the carbonyl group of the ester, and where z is the number of anhydride groups in the structure and is 1 or 2.

9) Hydrocarbon structures containing an acrylate functionality consisting of an ester group and at least one unsaturated bond that is conjugated with the carbonyl of the ester group, and having the general formula $C_nH_{2n+2-2x-2y-2z}(O_2)_z$ where n=1-12, and wher x is the number of cyclic rings in the structure and is between 0 and 4, and where y is the number of unsaturated bonds in the structure and is greater than or equal to 1, and where at least of the unsaturated bonds are conjugated with the carbonyl group of the ester, and where z is the number of ester groups in the structure and is 1 or 2. Examples: ethylmethacrylate (n=6, x=0, y=1, z=1), etc.

10) Hydrocarbon structures containing both ether and a carbonyl functional groups and having the general formula $C_nH_{2n+2-2w-2x-2y}(O)_y(O)_z$ where n=1-12, and where w is the number of cyclic rings in the structure and is between 0 and 4, and where x is the number of unsaturated bonds in the structure and is between 0 and n, and where y is the number of carbonyl groups in the structure in which the carbonyl group can be ketones and/or aldehydes, and where z is the number of ether groups in the structure and is 1 or 2, and where the ether group(s) can be endocyclic or exocyclic. Examples: ethoxymethacrolein (n=6, w=0, x=1, y=1, z=1), etc.

11) Hydrocarbon structures containing both ether and alcohol functional groups and having the general formula $C_nH_{2n+2-2w-2x-y}(OH)_y(O)_z$ where n=1-12, and where w is the number of cyclic rings in the structure and is between 0 and 4, and where x is the number of unsaturated bonds in the structure and is between 0 and n, and where y is the number of alcohol groups in the structure, and where z is the number of ether groups in the structure and is 1 or 2, and where the ether group(s) can be endocyclic or exocyclic. Examples: 3-hydroxytetrahydrofuran, etc.

12) Hydrocarbon structures containing any combination of functional groups selected from the following list: alcohol, ether, carbonyl, and carboxylic acid and having the general formula $C_nH_{2n+2-2u-2v-w-2y-3z}(OH)_w(O)_x(O)_y(OOH)_z$ where n=1-12, and where u is the number of cyclic rings in the structure and is between 0 and 4, and where v is the number of unsaturated bonds in the structure and is between 0 and n, and where w is the number of alcohol groups in the structure and is between 0 and 4, and where x is the number of ether groups in the structure and is between 0 and 4 and where the ether group(s) can be endocyclic or exocyclic, and where y is the number of carbonyl groups in the structure and is between 0 and 3 in which the carbonyl group can be ketones and/or aldehydes, and where z is the number of carboxylic acid groups in the structure and is between 0 and 2.

13) Hydrocarbon structures containing one or more primary amine groups and having the general formula $C_nH_{2n+2-2x-2y-z}(NH_2)_z$ where n=1-12, and where x is the number of cyclic rings in the structure and is between 0 and 4, and where y is the number of unsaturated bonds in the structure and is between 0 and n, and where z is the number of amine groups in the compounds and is between 1 and 4, and where the amine functionality can be exo- and/or endocyclic. Examples: cyclopentylamine (n=5, x=1, y=0, z=1), etc.

14) Hydrocarbon structures containing one or more secondary amine groups and having the general formula $C_nH_{2n+2-2x-2y-2z}(NH)_z$ where n=1-12, and where x is the number of cyclic rings in the structure and is between 0 and 4, and where y is the number of unsaturated bonds in the structure and is between 0 and n, and where z is the number of secondary amine groups in the compounds and is between 1 and 4, and where the amine functionality can be exo- and/or endocyclic. Examples: diisopropylamine (n=6, x=0, y=0, z=1), piperidine (n=5, x=1, y=0, z=1), pyride (n=5, x=1, y=3, z=1), etc.

15) Hydrocarbon structures containing one or more tertiary amine groups and having the general formula $C_nH_{2n+2-2x-2y-3z}(N)_z$ where n=1-12, and where x is the number of cyclic rings in the structure and is between 0 and 4, and where y is the number of unsaturated bonds in the structure and is between 0 and n, and where z is the number of tertiary amine groups in the compounds and is between 1 and 4, and where the amine functionality can be exo- and/or endocyclic. Examples: triethylamine (n=6, x=0, y=0, z=1), N-methylpyrrolidine (n=5, x=1, y=0, z=1), N-methylpyrrole (n=5, x=1, y=2, z=1), etc.

16) Hydrocarbon structures containing one or more nitro groups and having the general formula $C_nH_{2n+2-2x-2y-z}(NO_2)_z$ where n=1-12, and where x is the number of cyclic rings in the structure and is between 0 and 4, and where y is the number of unsaturated bonds in the structure and is between 0 and n, and where z is the number of nitro groups in the compounds and is between 1 and 4, and where the nitro functionality can be exo- and/or endocyclic. Examples: nitrocyclopentane (n=5, x=1, y=0, z=1), nitrobenzene (n=6, x=1, y=3, z=1), etc.

17) Hydrocarbon structures having both amine and ether functional groups having the general formula $C_nH_{2n+2-2u-2v-w-2x-3y-z}(NH_2)_w(NH)_x(N)_y(OH)_z$ with $C_nH_{2n+2-2u-2v-w-2x-3y-z}(NH_2)_w(NH)_x(N)_y(O)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of ether linkages in the compound and is between 1 and 4, and where the ether and/or amine groups can be exo- and/or endocyclic. Examples: 2-(2-aminoethylamino)ethanol (n=4, u=0, v=0, w=1, x=1, y=0, z=1), N-methyl morpholine (n=5, u=1, v=0, w=0, x=0, y=1, z=1), etc.

18) Hydrocarbon structures having both amine and alcohol functional groups having the general formula $C_nH_{2n+2-2u-2v-w-2x-3y-z}(NH_2)_w(NH)_x(N)_y(OH)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of ether groups in the compound and is between 1 and 4, and where the ether and/or amine groups can be exo- and/or endocyclic. Examples: tetrahydrofurfurylamine (n=5, u=1, v=0, w=1, x=0, y=0, z=1), etc.

19) Hydrocarbon structures having both amine and carbonyl functional groups having the general formula $C_nH_{2n+2-2u-2v-w-2x-3y-2z}(NH_2)_w(NH)_x(N)_y(O)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of carbonyl groups in the compound and is between 1 and 4, and where the carbonyl groups can be aldehyde(s) and/or ketone(s), and where the carbonyl and/or amine groups can be exo- and/or endocyclic. Examples: N,N-diethylformamide (n=5, u=0, v=0, w=0, x=0, y=1, z=1), (dimethylamine)acetone (n=5, u=0, v=0, w=0, x=0, y=1, z=1), N-methylpyrollidinone (n=5, u=1, v=1, w=0, x=0, y=1, z=1), etc.

In certain embodiments, the precursor mixture further comprises a porogenated precursor. The following are non-limiting examples of Si-based porogenated precursors, where the porogen material is one or more of $R^1$, $R^3$ or $R^7$:

$R^1_n(OR^2)_{3-n}Si$ where $R^1$ can be independently H, $C_1$ to $C_{12}$, linear or branched, saturated, singly or multiply unsaturated, cyclic, partially or fully fluorinated; $R^2$ can be independently $C_1$ to $C_{12}$, linear or branched, saturated, singly or multiply unsaturated, cyclic, aromatic, partially or fully fluorinated, n is 1 to 3.
Example: diethoxy-neo-hexylsilane $R^1_n(OR^2)_{3-n}Si-O-SiR^3_m(OR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.
Example: 1,3-diethoxy-1-neo-hexyldisiloxane $R^1_n(OR^2)_{3-n}Si-SiR^3_m(OR^4)_{3-m}$ where $R^1$ and $R^3$ can be independently H, $C_1$ to $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.
Example: 1,2-diethoxy-1-neo-hexyldisilane $R^1_n(OR^2)_{3-n}Si-R^7SiR^3_m(OR^4)_{3-m}$ where $R^1$ and $R^3$ can be independently $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, $R^7$ is $C_1$ to $C_{12}$, linear or branched, saturated, singly or multiply unsaturated, cyclic, partially or fully fluorinated, and bridges the two Si atoms, n is 1 to 3 and m is 1 to 3.
Example: 1,4-bis(dimethoxysilyl)cyclohexane $R^1_n(OR^2)_{3-n}Si-SiR^3_m(OR^4)_{3-m}$ where $R^1$ and $R^3$ can be independently H, $C_1$ to $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.
Example: 1,2-diethoxy-1-neo-hexyldisilane $R^1_n(O(O)CR^2)_{4-n}Si$ where $R^1$ can be independently H, $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, n is 1 to 3.
Example: diacetoxy-neo-hexylsilane $R^1_n(O(O)CR^2)_{3-n}Si-O-SiR^3_m(O(O)CR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently H, $C_1$ to $C_{12}$, linear or branched, saturated, singly or multiply unsaturated, cyclic, aromatic, partially or fully fluorinated, n is 1 to 3 and m is 1 to 3.
Example: 1,3-diacetoxy-1-neo-hexyldisiloxane $R^1_n(O(O)CR^2)_{3-n}Si-SiR^3_m(O(O)CR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently H, $C_1$ to $C_{12}$, linear or branched, saturated, singly or multiply unsaturated, cyclic, aromatic, partially or fully fluorinated, n is 1 to 3 and m is 1 to 3.
Example: 1,2-diacetoxy-1-neo-hexyldisilane $R^1_n(O(O)CR^2)_{3-n}Si-O-SiR^3_m(OR^4)_{3-m}$ where $R^1$ and $R^3$ can be independently H $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, $R^4$ can be independently $C_1$ to $C_{12}$, linear or branched, saturated, singly or multiply unsaturated, cyclic, aromatic, partially or fully fluorinated, n is 1 to 3 and m is 1 to 3.
Example: 1-acetoxy-3,3-di-t-butoxy-1-neohexyldisiloxane $R^1_n(O(O)CR^2)_{3-n}Si-SiR^3_m(OR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1-acetoxy-2,2-di-t-butoxy-1-neohexyldisilane $R^1_n(OR^2)_p(O(O)CR^3)_{4-(n+p)}Si$ where $R^1$ can be independently H, $C_1$ to $C_{12}$, linear or branched, saturated, singly or multiply unsaturated, cyclic, partially or fully fluorinated, $R^2$ can be independently $C_1$ to $C_{12}$, linear or branched, saturated, singly or multiply unsaturated, cyclic, aromatic, partially or fully fluorinated; $R^3$ can be independently H, $C_1$ to $C_{12}$, linear or branched, saturated, singly or multiply unsaturated, cyclic, aromatic, partially or fully fluorinated, and n is 1 to 3 and p is 1 to 3.

Example: acetoxy-t-butoxy-neo-hexylsilane $R^1_n(OR^2)_p(O(O)CR^4)_{3-n-p}Si-O-SiR^3_m(O(O)CR^5)_q(OR^6)_{3-m-q}$ where $R^1$ and $R^3$ can be independently H, $C_1$ to $C_{12}$, linear or branched, saturated, singly or multiply unsaturated, cyclic, partially or fully fluorinated; $R^2$, $R^6$ can be independently $C_1$ to $C_{12}$, linear or branched, saturated, singly or multiply unsaturated, cyclic, aromatic, partially or fully fluorinated, $R^4$, $R^5$ can be independently H, $C_1$ to $C_{12}$, linear or branched, saturated, singly or multiply unsaturated, cyclic, aromatic, partially or fully fluorinated, n is 1 to 3, m is 1 to 3, p is 1 to 3 and q is 1 to 3.

Example: 1,3-diacetoxy-1,3-di-t-butoxy-1-neohexyldisiloxane $R^1_n(OR^2)_p(O(O)CR^4)_{3-n-p}Si-SiR^3m(O(O)CR^5)_q(OR^6)_{3-m-q}$ where $R^1$ and $R^3$ can be independently H, $C_1$ to $C_{12}$, linear or branched, saturated, singly or multiply unsaturated, cyclic, partially or fully fluorinated; $R^2$, $R^6$ can be independently $C_1$ to $C_{12}$, linear or branched, saturated, singly or multiply unsaturated, cyclic, aromatic, partially or fully fluorinated, $R^4$, $R^5$ can be independently H, $C_1$ to $C_{12}$, linear or branched, saturated, singly or multiply unsaturated, cyclic, aromatic, partially or fully fluorinated, n is 1 to 3, m is 1 to 3, p is 1 to 3 and q is 1 to 3.

Example: 1,2-diacetoxy-1,2-di-t-butoxy-1-neohexyldisilane cyclic siloxanes of the formula $(OSiR_1R_3)_x$, where $R^1$ and $R^3$ can be independently H, $C_1$ to $C_{12}$, linear or branched, saturated, singly or multiply unsaturated, cyclic, partially or fully fluorinated, and x may be any integer from 2 to 8.

Example: such as 1-neohexyl-1,3,5,7-tetramethylcyclotetrasiloxane

EXAMPLES

All experiments were performed on an Applied Materials Precision-5000 system in a 200 mm DxZ chamber fitted with an Advance Energy 2000 rf generator, using an undoped TEOS process kit. The recipe involved the following basic steps: initial set-up and stabilization of gas flows, deposition, and purge/evacuation of chamber prior to wafer removal.

Post treatment step(s) with thermal annealing were conducted in a tube furnace at 425° C. for at least 1 hour under $N_2$. Exposure to UV light was conducted using a 6000 Watt broadband ultraviolet lamp from Fusion UV fitted with an H+ bulb. The atmosphere was controlled by placing the films in a processing chamber equipped with a 12.52 mm thick synthetic silica plate so that the film could be irradiated with light. The pressure in the chamber was maintained between 0.3 and 760 torr.

The porogen:DEMS ratio is the relative molar concentration of the porogen precursor to the silicon-containing precursor introduced into the reaction chamber. As this ratio increases, the amount of porogen precursor relative to silicon-containing precursor increases. Because it is a molar ratio, the relative concentrations are on a per molecule basis; for example, a porogen:DEMS ratio of 4 means that there are four molecules of the porogen precursor introduced into the reaction chamber for every one molecule of the silicon-containing precursor.

The deposition rate is the rate at which the as-deposited film is formed on the substrate in the reaction chamber. It is determined by measuring the film thickness of the as-deposited film and dividing by the amount of time that the deposition occurred over. The deposition rate relates to the efficiency with which the porogen precursor and silicon-containing precursor undergo reaction in the deposition chamber to form the porogen and organosilicate, respectively, on the substrate surface.

Thickness and refractive index were measured on an SCI Filmtek 2000 Reflectometer. The refractive index of a material is defined as:

$$RI = \frac{c}{\upsilon}$$

where c is the speed of light in a vacuum and u is the speed of light through the film. The refractive index is measured using 632 nm light. The speed of light through the film depends on the electronic density of the film, which for the purposes of comparing and contrasting the as-deposited and final film properties of the films in this study, correlates reasonably with the dielectric constant. Therefore, films with higher refractive index generally have higher dielectric constant values. In general, the films after post-treating have lower refractive indices than the as-deposited films. This is because the porogen in the as-deposited films has been replaced with void space, and the refractive index of air is approximately 1.00029 compared to approximately 1.400-1.600 for the porogen.

The dielectric constant of a material, κ, is defined as $$\kappa = \frac{C}{C_0}$$

Where C is the capacitance of the dielectric and $C_0$ is the capacitance of a vacuum. Capacitances were measured on as-deposited and/or final porous organosilicate films deposited on low resistivity p-type silicon wafers (<0.02 ohm-cm) using the mercury probe technique.

Mechanical properties (nanoindentation hardness, Young's Modulus) were determined using an MTS Nano Indenter using standard protocols.

Thermal stability and off-gas products were determined by thermogravimetric analysis on a Thermo TA Instruments 2050 TGA. Compositional data were obtained by x-ray photoelectron spectroscopy (XPS) on a Physical Electronics 5000LS. The atomic % values reported in the tables do not include hydrogen.

In some of the following tables, "n/a" indicates that the data is not available.

Example 1

Figure 2:
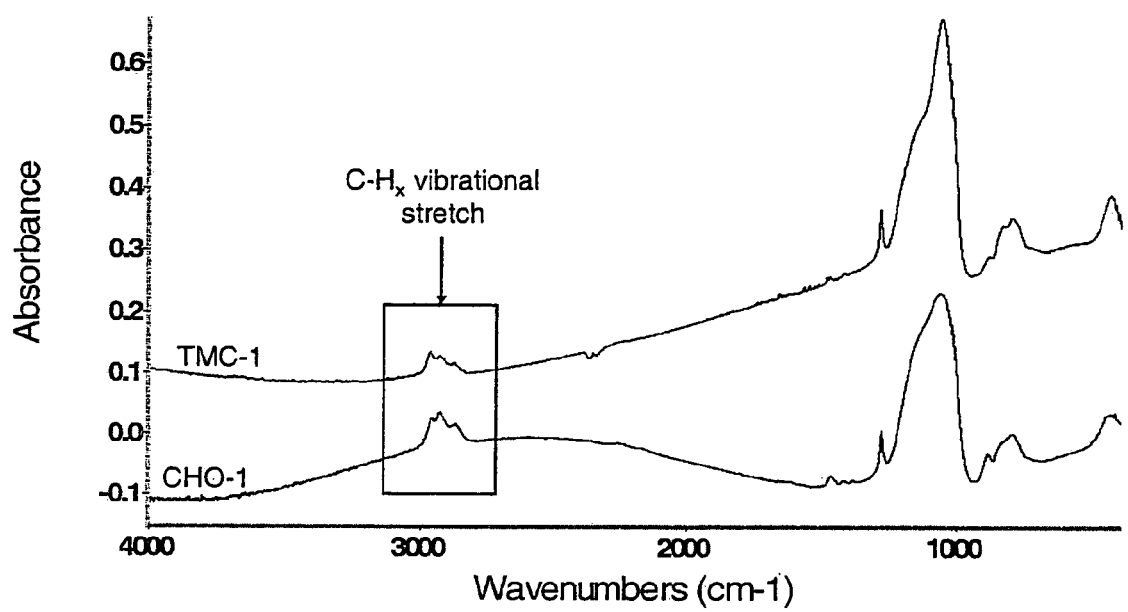
FIG. 2 provides the refractive index for two different porogen precursor stoichiometries for films deposited from the organosilane precursor diethoxymethylsilane (DEMS) and either cyclohexanone (CHO) or 1,2,4-trimethylcyclohexane (TMC) porogen precursors FIG. 3 provides the Fourier transform infrared (FT-IR) absorption spectrum for a porous OSG film deposited from the organosilane precursor DEMS and porogen precursors CHO or TMC after deposition and after exposure to UV light for 5 minutes.

Variation of the Porogen Precursor to Silicon-Containing Precursor Stoichiometry Composite films were deposited from a mixture of cyclohexanone (CHO) and diethoxymethylsilane (DEMS). The-deposition conditions were as follows: the plasma power was 450 Watts, reaction chamber pressure was 8 torr, electrode spacing was 350 milli-inches, carrier gas was Helium at a flow rate of 210 sccm, and the substrate temperature was 225° C. The CHO and DEMS flow rates were varied to control the ratio of CHO and DEMS introduced into the reaction chamber, while leaving constant the overall flow rate of chemical into the chamber. The films were post-treated by exposing them to broadband UV light ($\lambda$=200-400 nm) under vacuum for 5 minutes.

higher deposition rate and as-deposited refractive index, suggesting that there is a higher concentration of porogen in the as-deposited CHO film compared with the as-deposited TMC film. This higher amount of porogen in the CHO film can be readily observed by examining the FT-IR spectra of the as-deposited films, shown in FIG. 2. The spectra in FIG. 2 have been normalized to a film thickness of 1 micron. The porogen concentration in the as-deposited film is best observed as an increase in the C—$H_x$ vibrational stretching between 2700-3100 $cm^{-1}$. The data in Table 3 shows that the TABLES 1a and 1b As-deposited and final film properties, respectively, for films deposited using cyclohexanone and DEMS.

| CHO flow (mg/min) | DEMS flow (mg/min) | Total Flow (mg/min) | CHO:DEMS ratio | Deposition Rate (nm/min) | Refractive Index (As Dep'd) |
|---|---|---|---|---|---|
| 450 | 150 | 600 | 4.10 | 200 | 1.480 |
| 400 | 200 | 600 | 2.74 | 230 | 1.470 |
| 350 | 250 | 600 | 1.91 | 260 | 1.460 |

| CHO:DEMS ratio | UV Cure Shrinkage (%) | Refractive Index (Final) | Dielectric Constant (Final) | Young's Modulus (GPa) | Hardness (GPa) |
|---|---|---|---|---|---|
| 4.16 | 28 | 1.340 | 2.49 | 8.0 | 1.2 |
| 2.78 | 17 | 1.350 | 2.56 | 8.3 | 1.3 |
| 1.94 | 16 | 1.370 | 2.67 | 9.7 | 1.6 |

The data in Table 1a and 2a show that a change in the precursor stoichiometry changes the final properties of the films. This is because the amount of porogen precursor and silicon-containing precursor in the chemical feed entering the reaction chamber determines largely the amount of porogen and organosilicate, respectively, which are deposited on the substrate. For example, at the highest CHO:DEMS ratio, the lowest final film dielectric constant is achieved. As the CHO:DEMS ratio decreases both the dielectric constant and mechanical hardness of the films increase. Therefore, the film properties can be controlled by the amount of porogen precursor and the amount of organosilicon precursor in the reaction chamber Example 2

Porogen Precursor Functional Groups

The structure and/or composition of the porogen precursor may also be used to control the film properties. Composite films were deposited from CHO or 1,2,4-trimethylcyclohexane (TMC). Table 2 compares the neat liquid properties of these precursors. The CHO precursor consists of a 6 carbon ring with a ketone functional group, while the TMC precursor has a 6 carbon ring with three methyl groups attached at the 1, 2, and 4-positions.

peak area in the CHO-1 film is 5.25, while the peak area in the TMC-1 film is only 3.27. Thus, the CHO porogen precursor is more effective at increasing the C—$H_x$ bond concentration of an as-deposited composite film under similar process conditions.

TABLE 3

Deposition conditions, deposition rates, and refractive indices of the as-deposited composite films in example 2.

| Process Variable | TMC-1 | CHO-1 |
|---|---|---|
| Plasma Power (Watts) | 600 | 600 |
| Chamber Pressure (Torr) | 8 | 8 |
| Electrode Spacing (milli-inches) | 350 | 350 |
| Substrate Temperature (° C.) | 300 | 300 |
| Porogen Flow (mg/min) | 435 | 450 |
| DEMS Flow (mg/min) | 120 | 150 |
| Molar Porogen:DEMS ratio | 3.86 | 4.10 |
| Carrier Gas | $CO_2$ | He |
| Carrier Gas Flow (sccm) | 200 | 200 |
| Additive Gas | $O_2$ | $O_2$ |
| Additive Gas Flow (sccm) | 10 | 10 |
| Deposition Rate (nm/min) | 150 | 290 |
| Refractive Index | 1.452 | 1.515 |
| FT-IR C—$H_x$ peak area | 3.27 | 5.25 |

TABLE 2

Properties of neat liquid porogen precursors.

| Porogen Precursor | Formula | H/C ratio | Molecular Weight | Density (g/mL) | Refractive Index | Boiling Point (° C.) |
|---|---|---|---|---|---|---|
| Cyclohexanone (CHO) | $C_6H_{10}O$ | 1.67 | 98.15 | 0.947 | 1.450 | 155 |
| 1,2,4-Trimethylcyclohexane (TMC) | $C_9H_{18}$ | 2.0 | 126.24 | 0.786 | 1.433 | 141-143 |

Figure 3:
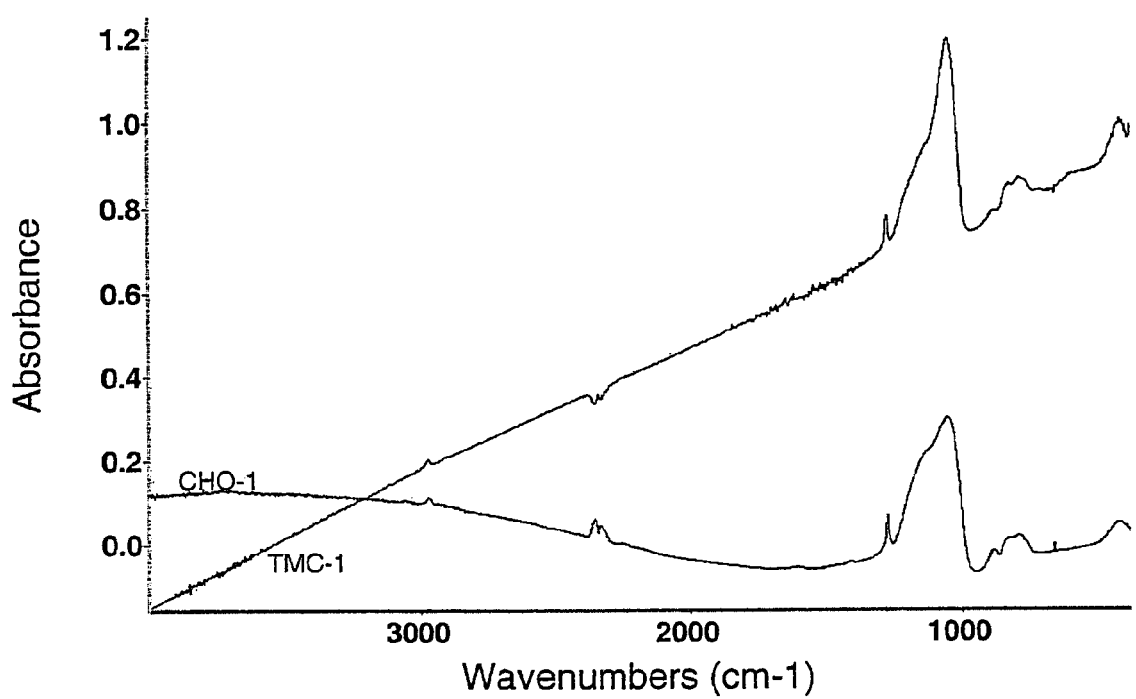

The deposition conditions for composite films deposited from TMC and DEMS, or CHO and DEMS are detailed in Table 3. The film deposited using the CHO precursor has a FIG. 3 shows the FT-IR spectra of the CHO-1 and TMC-1 films after exposure to broadband UV light for 5 minutes under vacuum. The spectra show that the C—$H_x$ peak areas of both films have decreased to approximately 0.9 and 0.6, respectively. The differences between the intensities of the C—$H_x$ peaks after porogen removal can be attributed to the higher amount of Si—$CH_3$ groups in the CHO-1 film, which contribute some absorption in this region.

The final film properties for TMC-1 and CHO-1 after exposure to broadband UV light for 5 minutes under vacuum are listed in Table 4. The data shows that the CHO-1 film has a lower dielectric constant than the TMC-1 film. This is due to the higher porogen concentration, and hence the higher degree of porosity, achieved using the CHO precursor. Therefore, it may be advantageous for certain applications to select a porogen precursor with a ketone or other functional group over a porogen precursor that has a purely organic composition to enhance one or more properties of a porous organosilicate film.

TABLE 4

Final porous film properties for the films in comparative example 2.

| Film | Refractive Index | Dielectric Constant | UV Cure Shrinkage (%) | Young's Modulus (GPa) | Hardness (GPa) | FT-IR C—$H_x$ peak area |
|---|---|---|---|---|---|---|
| TMC-1 | 1.410 | 2.61 | 7 | 4.8 | 0.6 | 0.6 |
| CHO-1 | 1.370 | 2.77 | 6 | 10.8 | 1.5 | 0.9 |

Example 3

Composite films were deposited from a mixture of cyclohexanone (CHO) and diethoxymethylsilane (DEMS) in a 22/78 by mole percent ratio. The deposition conditions were as follows: the plasma power was 600 Watts, reaction chamber pressure was 8 torr, electrode spacing was 350 milli-inches, carrier gas was $CO_2$ at a flow rate of 200 sccm, additive gas was $O_2$ at a flow rate of 10 sccm, the deposition rate was 450 nanometers (nm) per minute, and the substrate temperature was 250° C. The CHO and DEMS flow rates were varied to control the ratio of CHO and DEMS introduced into the reaction chamber while leaving constant the overall flow rate of chemical into the chamber. The films were post-treated by exposing them to broadband UV light ($\lambda$=200-400 nm) under vacuum for 5 minutes and the percentage of shrinkage was 30%. Various characteristics of the as-deposited and final film after exposure to UV treatment is provided in Table 5.

Figure 4:
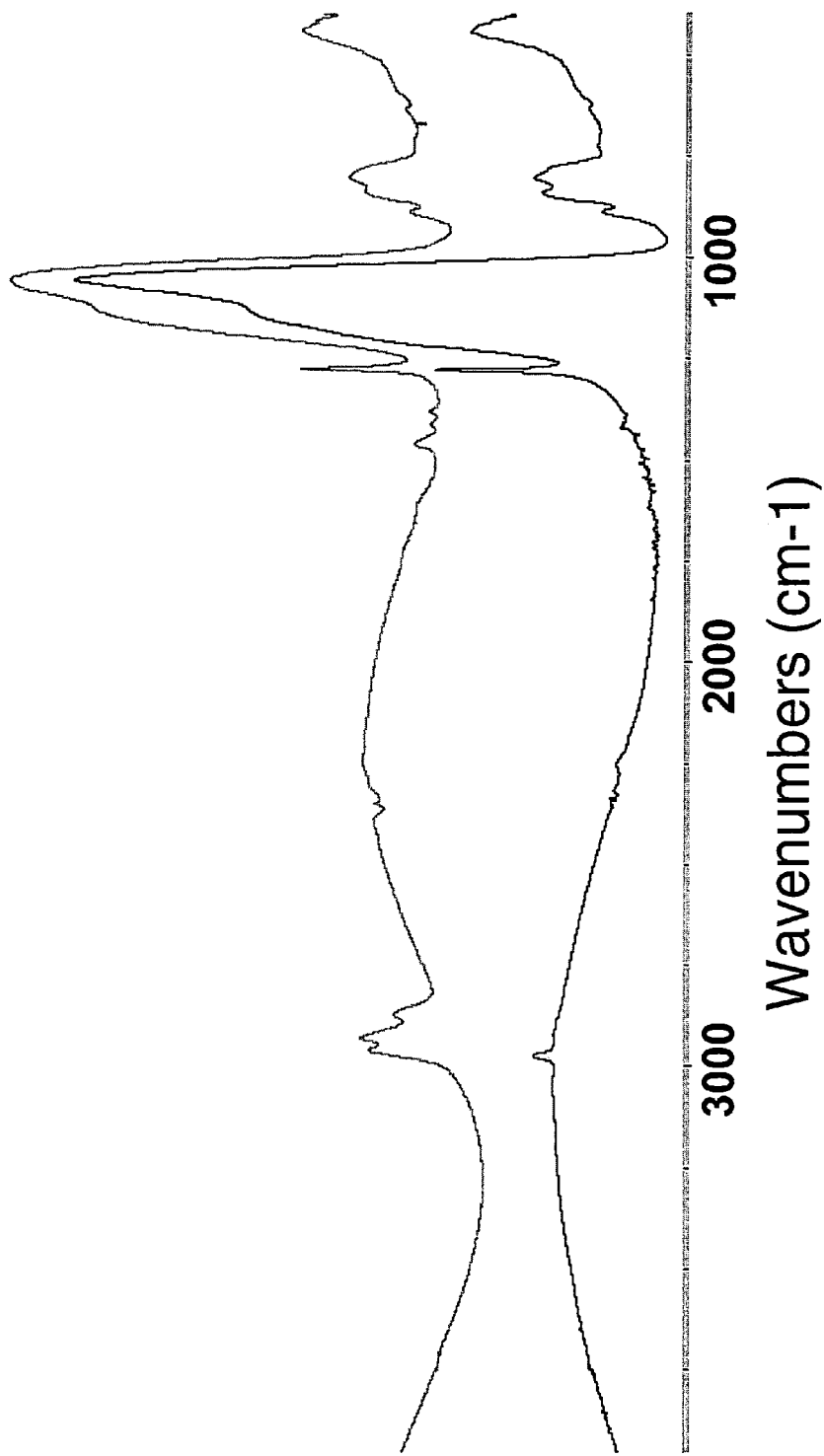
FIG. 4 provides the FT-IR absorption spectrum for a film deposited from a precursor mixture comprising DEMS and CHO in a 22/78 by mole percent blend.

FIG. 4 shows the FT-IR spectra of the DEMS/CHO films before or as-deposited and after exposure to broadband UV light for 5 minutes under vacuum. The spectra show that the C—$H_x$ peak area of the post-UV treated film relative to the as-deposited film has decreased by approximately 84%.

TABLE 5

As-deposited and final film properties, respectively, for films deposited using DEMS/CHO (22/78)

| Property | As-deposited | Final |
|---|---|---|
| Refractive Index | 1.486 | 1.340 |
| Dielectric Constant | n/a | 2.3 |

Example 4

Composite films were deposited from a mixture of DMHD and diethoxymethylsilane (DEMS) in a 20/80 by mole percent ratio. The deposition conditions were as follows: the plasma power was 600 Watts, reaction chamber pressure was 8 torr, electrode spacing was 350 milli-inches, carrier gas was CO2 at a flow rate of 200 sccm, additive gas was O2 at a flow rate of 10 sccm, and the substrate temperature was 300° C. The DMHD and DEMS flow rates were varied to control the ratio of DMHD and DEMS introduced into the reaction chamber while leaving constant the overall flow rate of chemical into the chamber. The films were post-treated by exposing them to broadband UV light ($\lambda$=200-400 nm) under vacuum for 5 minutes and the percentage of shrinkage was 30%. Various characteristics of the as-deposited and final film after exposure to UV treatment is provided in Table 6.

Figure 5:
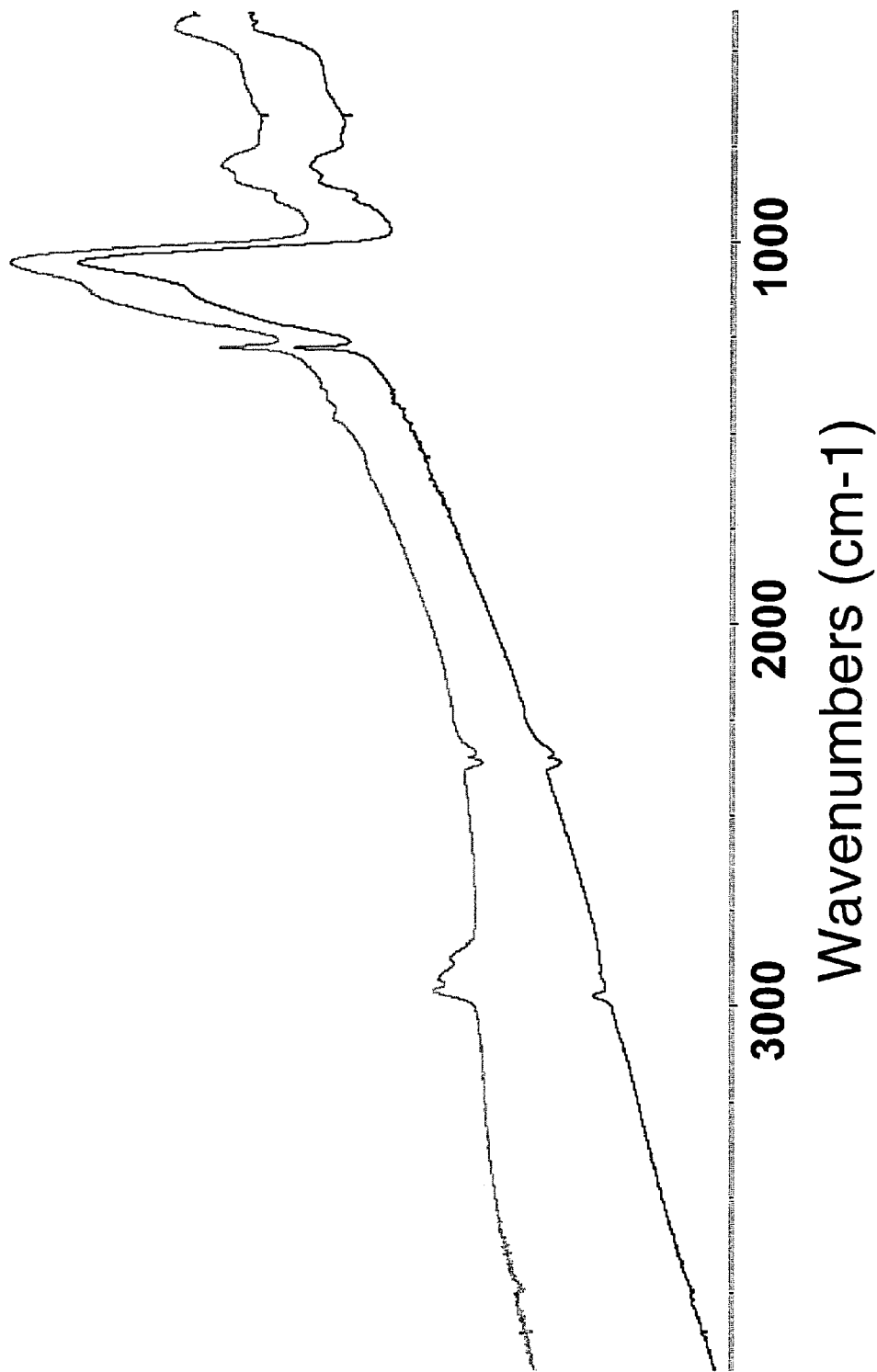
FIG. 5 provides the FT-IR absorption spectrum for a film deposited from a precursor mixture comprising DEMS and DMHD in a 20/80 by mole percent blend.

FIG. 5 shows the FT-IR spectra of the DEMS/DMHD films before or as-deposited and after exposure to broadband UV light for 5 minutes under vacuum.

TABLE 6

As-deposited and final film properties, respectively, for films deposited using DEMS/DMHD (22/78)

| Property | As-deposited | Final |
|---|---|---|
| Refractive Index | 1.48 | 1.35 |
| Dielectric Constant | n/a | 2.47 |
| Hardness | n/a | 0.9 |
| Elastic Modulus | n/a | 6.2 |

Example 5

Figure 6:
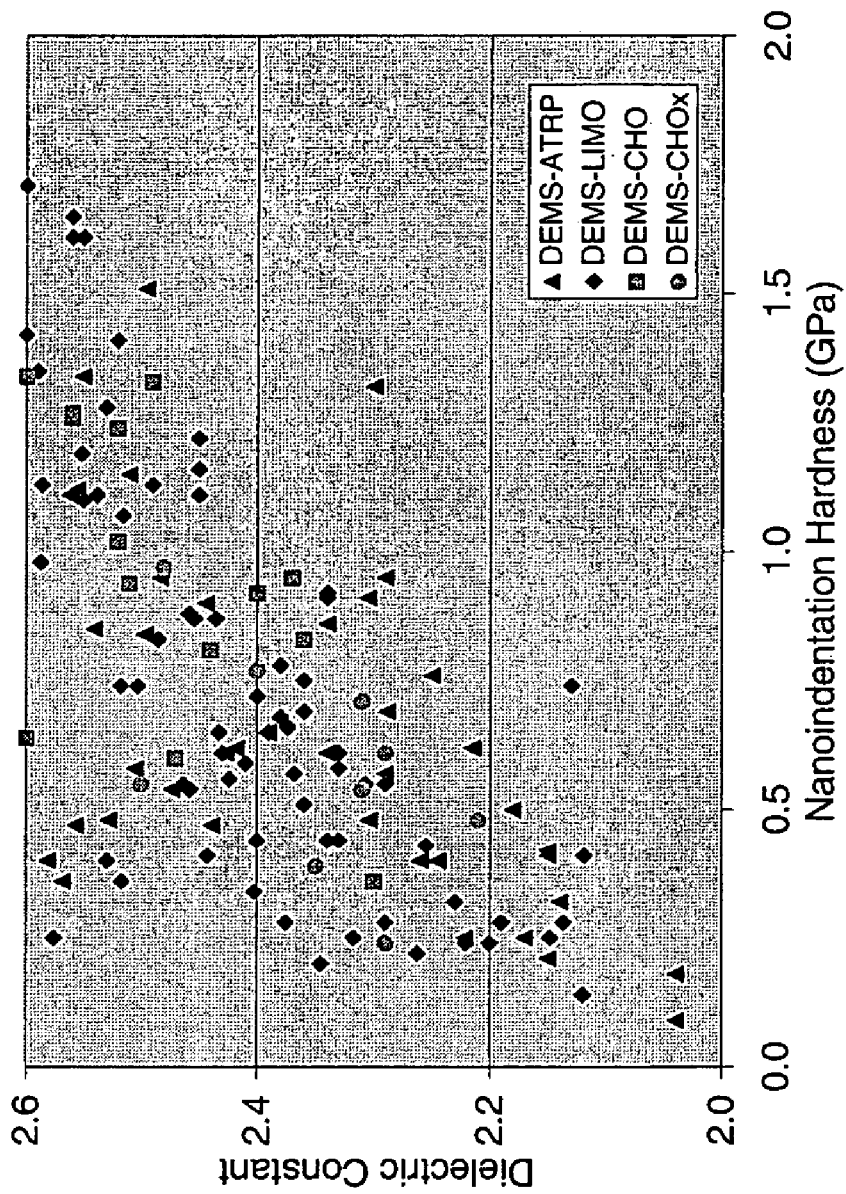
FIG. 6 provides the hardness vs. dielectric constant for films deposited from precursor mixtures comprising alpha-terpinene (ATP), limonene (LIM), CHO, and cyclohexane oxide (CHOx).

Films containing DEMS were deposited using the following porogen precursors: ATP, LIM, CHO, CHOx. The deposition conditions for each film are provided in Tables 7a through 7d. The characteristics of the final film after exposure to a UV cure for 5 minutes is provided in Table 8a through 8d. FIG. 6 illustrates the relationship between hardness and dielectric constant for these films.

TABLE 7A

Deposition Conditions for DEMS + ATRP

| Run # | Power (Watts) | Pressure (torr) | Spacing (mils) | Temperature (C.) | ATRP Flow (mg/min) | DEMS Flow (mg/min) | Carrier | Carrier (sccm) | Additive | Additive (sccm) | Additive 2 | Additive 2 (ssm) | ATRP/DEMS ratio |
|---|---|---|---|---|---|---|---|---|---|---|---|---|---|
| 1 | 450 | 8 | 300 | 225 | 800 | 200 | He | 500 | O2 | 50 | — | 0 | 4.0 |
| 2 | 450 | 8 | 300 | 225 | 800 | 200 | He | 500 | O2 | 50 | — | 0 | 4.0 |
| 3 | 450 | 8 | 300 | 225 | 720 | 180 | He | 500 | O2 | 50 | — | 0 | 4.0 |
| 4 | 450 | 8 | 300 | 225 | 800 | 200 | He | 750 | O2 | 50 | — | 0 | 4.0 |
| 5 | 450 | 8 | 300 | 225 | 800 | 200 | He | 450 | O2 | 50 | Ar | 300 | 4.0 |
| 6 | 450 | 8 | 300 | 225 | 800 | 200 | He | 750 | O2 | 50 | — | 0 | 4.0 |
| 7 | 450 | 8 | 300 | 225 | 880 | 220 | He | 500 | O2 | 50 | — | 0 | 4.0 |

TABLE 7A-continued

Deposition Conditions for DEMS + ATRP

| Run # | Power (Watts) | Pressure (torr) | Spacing (mils) | Temperature (C.) | ATRP Flow (mg/min) | DEMS Flow (mg/min) | Carrier | Carrier (sccm) | Additive | Additive (sccm) | Additive 2 | Additive 2 (ssm) | ATRP/DEMS ratio |
|---|---|---|---|---|---|---|---|---|---|---|---|---|---|
| 8 | 750 | 8 | 350 | 300 | 660 | 165 | CO2 | 200 | O2 | 10 | — | 0 | 4.0 |
| 9 | 750 | 8 | 350 | 300 | 490 | 210 | CO2 | 200 | O2 | 25 | — | 0 | 2.3 |
| 10 | 750 | 8 | 350 | 300 | 580 | 145 | CO2 | 200 | O2 | 10 | — | 0 | 4.0 |
| 11 | 600 | 6 | 350 | 300 | 580 | 145 | CO2 | 200 | O2 | 10 | — | 0 | 4.0 |
| 12 | 600 | 8 | 350 | 300 | 580 | 145 | CO2 | 200 | O2 | 10 | — | 0 | 4.0 |
| 13 | 450 | 8 | 300 | 225 | 800 | 200 | He | 450 | O2 | 50 | CO2 | 300 | 4.0 |
| 14 | 750 | 8 | 350 | 300 | 760 | 190 | CO2 | 200 | O2 | 25 | — | 0 | 4.0 |
| 15 | 750 | 8 | 350 | 300 | 760 | 190 | CO2 | 200 | O2 | 25 | — | 0 | 4.0 |
| 16 | 750 | 8 | 350 | 300 | 490 | 210 | CO2 | 200 | O2 | 25 | — | 0 | 2.3 |
| 17 | 750 | 8 | 350 | 300 | 760 | 190 | CO2 | 200 | O2 | 10 | — | 0 | 4.0 |
| 18 | 750 | 8 | 350 | 300 | 760 | 190 | CO2 | 200 | O2 | 10 | — | 0 | 4.0 |
| 19 | 600 | 6 | 350 | 300 | 490 | 210 | CO2 | 200 | O2 | 25 | — | 0 | 2.3 |
| 20 | 600 | 8 | 350 | 300 | 420 | 105 | CO2 | 220 | O2 | 25 | — | 0 | 4.0 |
| 21 | 750 | 10 | 350 | 300 | 490 | 210 | CO2 | 200 | O2 | 25 | — | 0 | 2.3 |
| 22 | 600 | 8 | 550 | 300 | 580 | 145 | CO2 | 600 | O2 | 10 | — | 0 | 4.0 |
| 23 | 600 | 8 | 550 | 300 | 580 | 145 | CO2 | 600 | O2 | 10 | — | 0 | 4.0 |
| 24 | 750 | 8 | 350 | 330 | 420 | 105 | CO2 | 200 | O2 | 50 | — | 0 | 4.0 |
| 25 | 750 | 8 | 350 | 330 | 420 | 105 | CO2 | 200 | O2 | 50 | — | 0 | 4.0 |
| 26 | 750 | 8 | 350 | 350 | 420 | 105 | CO2 | 200 | O2 | 25 | — | 0 | 4.0 |
| 27 | 750 | 8 | 350 | 300 | 560 | 240 | CO2 | 200 | O2 | 25 | — | 0 | 2.3 |
| 28 | 750 | 8 | 350 | 330 | 360 | 90 | CO2 | 200 | O2 | 50 | — | 0 | 4.0 |
| 29 | 600 | 8 | 350 | 300 | 490 | 210 | CO2 | 200 | O2 | 25 | — | 0 | 2.3 |
| 30 | 600 | 8 | 550 | 300 | 580 | 145 | CO2 | 400 | O2 | 10 | — | 0 | 4.0 |
| 31 | 600 | 8 | 450 | 300 | 580 | 145 | CO2 | 200 | O2 | 10 | — | 0 | 4.0 |
| 32 | 750 | 8 | 400 | 300 | 490 | 210 | CO2 | 200 | O2 | 25 | — | 0 | 2.3 |
| 33 | 600 | 6 | 350 | 300 | 490 | 210 | CO2 | 200 | — | 0 | — | 0 | 2.3 |
| 34 | 600 | 10 | 350 | 300 | 580 | 145 | CO2 | 200 | O2 | 10 | — | 0 | 4.0 |
| 35 | 750 | 8 | 350 | 350 | 420 | 105 | CO2 | 200 | O2 | 50 | — | 0 | 4.0 |
| 36 | 750 | 8 | 350 | 350 | 420 | 105 | CO2 | 200 | O2 | 50 | — | 0 | 4.0 |
| 37 | 750 | 8 | 350 | 330 | 420 | 105 | CO2 | 200 | O2 | 75 | — | 0 | 4.0 |
| 38 | 600 | 8 | 350 | 330 | 420 | 105 | CO2 | 220 | O2 | 25 | — | 0 | 4.0 |
| 39 | 750 | 8 | 350 | 350 | 360 | 90 | CO2 | 200 | O2 | 50 | — | 0 | 4.0 |
| 40 | 450 | 6 | 350 | 300 | 490 | 210 | CO2 | 200 | O2 | 25 | — | 0 | 2.3 |
| 41 | 750 | 8 | 350 | 330 | 480 | 120 | CO2 | 200 | O2 | 50 | — | 0 | 4.0 |
| 42 | 450 | 6 | 350 | 300 | 490 | 210 | CO2 | 200 | O2 | 25 | — | 0 | 2.3 |
| 43 | 750 | 8 | 350 | 300 | 490 | 210 | CO2 | 200 | O2 | 35 | — | 0 | 2.3 |
| 44 | 750 | 10 | 350 | 325 | 490 | 210 | CO2 | 200 | O2 | 25 | — | 0 | 2.3 |
| 45 | 750 | 8 | 350 | 300 | 420 | 180 | CO2 | 200 | O2 | 25 | — | 0 | 2.3 |
| 46 | 750 | 8 | 300 | 300 | 490 | 210 | CO2 | 200 | O2 | 25 | — | 0 | 2.3 |
| 47 | 600 | 8 | 550 | 300 | 580 | 145 | CO2 | 200 | O2 | 10 | — | 0 | 4.0 |
| 48 | 750 | 8 | 350 | 350 | 480 | 120 | CO2 | 200 | O2 | 50 | — | 0 | 4.0 |

TABLE 7B

Deposition Conditions for DEMS + LIMO

| Run # | Power (Watts) | Pressure (torr) | Spacing (mils) | Temperature (C.) | LIMO Flow (mg/min) | DEMS Flow (mg/min) | Carrier | Carrier (sccm) | Additive | Additive (sccm) | Additive 2 | Additive 2 (ssm) | LIMO/DEMS ratio |
|---|---|---|---|---|---|---|---|---|---|---|---|---|---|
| 1 | 750 | 8 | 350 | 300 | 850 | 150 | CO2 | 200 | O2 | 25 | — | 0 | 5.7 |
| 2 | 750 | 8 | 350 | 300 | 723 | 127.5 | CO2 | 200 | O2 | 25 | — | 0 | 5.7 |
| 3 | 600 | 8 | 400 | 250 | 568 | 142 | CO2 | 250 | — | 0 | — | 0 | 4.0 |
| 4 | 750 | 8 | 350 | 300 | 808 | 142.5 | CO2 | 200 | O2 | 25 | — | 0 | 5.7 |
| 5 | 750 | 8 | 350 | 300 | 680 | 120 | CO2 | 200 | O2 | 25 | — | 0 | 5.7 |
| 6 | 600 | 8 | 400 | 200 | 500 | 200 | CO2 | 300 | — | 0 | — | 0 | 2.5 |
| 7 | 750 | 8 | 350 | 300 | 659 | 116.25 | CO2 | 200 | O2 | 25 | — | 0 | 5.7 |
| 8 | 750 | 8 | 350 | 300 | 560 | 240 | CO2 | 200 | O2 | 10 | — | 0 | 2.3 |
| 9 | 600 | 8 | 350 | 250 | 450 | 150 | CO2 | 200 | O2 | 10 | — | 0 | 3.0 |
| 10 | 600 | 8 | 350 | 250 | 450 | 150 | CO2 | 200 | O2 | 10 | — | 0 | 3.0 |
| 11 | 600 | 8 | 400 | 250 | 456 | 114 | CO2 | 250 | — | 0 | — | 0 | 4.0 |
| 12 | 750 | 8 | 350 | 300 | 765 | 135 | CO2 | 200 | O2 | 25 | — | 0 | 5.7 |
| 13 | 450 | 8 | 300 | 225 | 720 | 180 | He | 750 | O2 | 50 | — | 0 | 4.0 |
| 14 | 750 | 8 | 350 | 300 | 638 | 112.5 | CO2 | 200 | O2 | 25 | — | 0 | 5.7 |
| 15 | 750 | 8 | 350 | 300 | 350 | 150 | CO2 | 200 | O2 | 25 | — | 0 | 2.3 |
| 16 | 750 | 8 | 350 | 300 | 490 | 210 | CO2 | 200 | O2 | 10 | — | 0 | 2.3 |
| 17 | 700 | 8 | 350 | 300 | 210 | 217.5 | CO2 | 200 | O2 | 10 | — | 0 | 1.0 |
| 18 | 600 | 8 | 350 | 300 | 210 | 195 | CO2 | 200 | O2 | 10 | — | 0 | 1.1 |
| 19 | 750 | 8 | 350 | 300 | 333 | 142.5 | CO2 | 200 | O2 | 25 | — | 0 | 2.3 |
| 20 | 600 | 8 | 400 | 250 | 680 | 170 | CO2 | 250 | — | 0 | — | 0 | 4.0 |

TABLE 7B-continued

Deposition Conditions for DEMS + LIMO

| Run # | Power (Watts) | Pressure (torr) | Spacing (mils) | Temperature (C.) | LIMO Flow (mg/min) | DEMS Flow (mg/min) | Carrier | Carrier (sccm) | Additive | Additive (sccm) | Additive 2 | Additive 2 (ssm) | LIMO/DEMS ratio |
|---|---|---|---|---|---|---|---|---|---|---|---|---|---|
| 21 | 500 | 6 | 350 | 300 | 210 | 217.5 | CO2 | 200 | O2 | 10 | — | 0 | 1.0 |
| 22 | 600 | 8 | 350 | 300 | 450 | 150 | CO2 | 200 | O2 | 10 | — | 0 | 3.0 |
| 23 | 600 | 8 | 350 | 300 | 450 | 150 | CO2 | 200 | O2 | 10 | — | 0 | 3.0 |
| 24 | 750 | 8 | 350 | 300 | 595 | 105 | CO2 | 200 | O2 | 25 | — | 0 | 5.7 |
| 25 | 450 | 8 | 300 | 225 | 800 | 200 | He | 450 | O2 | 50 | Ar | 300 | 4.0 |
| 26 | 450 | 8 | 300 | 225 | 800 | 200 | He | 750 | O2 | 50 | — | 0 | 4.0 |
| 27 | 450 | 8 | 300 | 225 | 800 | 200 | He | 750 | O2 | 50 | — | 0 | 4.0 |
| 28 | 750 | 8 | 350 | 300 | 507.5 | 217.5 | CO2 | 200 | O2 | 10 | — | 0 | 2.3 |
| 29 | 750 | 8 | 350 | 300 | 368 | 157.5 | CO2 | 200 | O2 | 25 | — | 0 | 2.3 |
| 30 | 750 | 8 | 350 | 300 | 385 | 165 | CO2 | 200 | O2 | 25 | — | 0 | 2.3 |
| 31 | 750 | 8 | 350 | 300 | 553 | 97.5 | CO2 | 200 | O2 | 25 | — | 0 | 5.7 |
| 32 | 600 | 8 | 350 | 300 | 210 | 217.5 | CO2 | 200 | O2 | 10 | — | 0 | 1.0 |
| 33 | 500 | 6 | 350 | 300 | 210 | 195 | CO2 | 200 | O2 | 10 | — | 0 | 1.1 |
| 34 | 700 | 10 | 350 | 300 | 210 | 217.5 | CO2 | 200 | O2 | 10 | — | 0 | 1.0 |
| 35 | 750 | 8 | 350 | 300 | 315 | 135 | CO2 | 200 | O2 | 25 | — | 0 | 2.3 |
| 36 | 750 | 8 | 350 | 300 | 315 | 135 | CO2 | 200 | O2 | 25 | — | 0 | 2.3 |
| 37 | 450 | 8 | 300 | 225 | 800 | 200 | He | 450 | O2 | 50 | CO2 | 300 | 4.0 |
| 38 | 750 | 8 | 350 | 300 | 490 | 210 | CO2 | 200 | — | 0 | — | 0 | 2.3 |
| 39 | 600 | 6 | 350 | 300 | 210 | 217.5 | CO2 | 200 | O2 | 10 | — | 0 | 1.0 |
| 40 | 700 | 8 | 350 | 300 | 630 | 270 | CO2 | 200 | O2 | 25 | — | 0 | 2.3 |
| 41 | 450 | 8 | 300 | 225 | 880 | 220 | He | 750 | O2 | 50 | — | 0 | 4.0 |
| 42 | 750 | 8 | 350 | 300 | 420 | 180 | CO2 | 200 | O2 | 25 | — | 0 | 2.3 |
| 43 | 750 | 8 | 350 | 300 | 420 | 180 | CO2 | 200 | O2 | 25 | — | 0 | 2.3 |
| 44 | 600 | 8 | 350 | 300 | 630 | 270 | CO2 | 200 | O2 | 25 | — | 0 | 2.3 |
| 45 | 750 | 8 | 350 | 300 | 510 | 90 | CO2 | 200 | O2 | 25 | — | 0 | 5.7 |
| 46 | 600 | 8 | 350 | 300 | 507.5 | 217.5 | CO2 | 200 | O2 | 10 | — | 0 | 2.3 |
| 47 | 450 | 6 | 350 | 300 | 507.5 | 217.5 | CO2 | 200 | O2 | 10 | — | 0 | 2.3 |
| 48 | 500 | 6 | 350 | 300 | 210 | 232.5 | CO2 | 200 | O2 | 10 | — | 0 | 0.9 |
| 49 | 700 | 8 | 350 | 300 | 630 | 270 | CO2 | 200 | O2 | 10 | — | 0 | 2.3 |
| 50 | 750 | 8 | 350 | 325 | 490 | 210 | CO2 | 200 | O2 | 25 | — | 0 | 2.3 |
| 51 | 750 | 8 | 350 | 300 | 455 | 195 | CO2 | 200 | O2 | 25 | — | 0 | 2.3 |
| 52 | 750 | 8 | 350 | 325 | 490 | 210 | CO2 | 200 | O2 | 10 | — | 0 | 2.3 |
| 53 | 750 | 8 | 350 | 325 | 560 | 240 | CO2 | 200 | O2 | 10 | — | 0 | 2.3 |
| 54 | 600 | 8 | 350 | 300 | 507.5 | 217.5 | CO2 | 200 | O2 | 10 | — | 0 | 2.3 |
| 55 | 750 | 8 | 350 | 325 | 560 | 240 | CO2 | 200 | O2 | 25 | — | 0 | 2.3 |
| 56 | 750 | 8 | 350 | 325 | 630 | 270 | CO2 | 200 | O2 | 10 | — | 0 | 2.3 |
| 57 | 750 | 8 | 350 | 300 | 280 | 120 | CO2 | 200 | O2 | 25 | — | 0 | 2.3 |
| 58 | 650 | 8 | 350 | 300 | 630 | 270 | CO2 | 200 | O2 | 25 | — | 0 | 2.3 |
| 59 | 600 | 8 | 350 | 300 | 507.5 | 217.5 | CO2 | 200 | O2 | 10 | — | 0 | 2.3 |
| 60 | 750 | 8 | 350 | 300 | 630 | 270 | CO2 | 200 | — | 0 | — | 0 | 2.3 |
| 61 | 600 | 8 | 350 | 300 | 210 | 232.5 | CO2 | 200 | O2 | 10 | — | 0 | 0.9 |
| 62 | 650 | 8 | 350 | 300 | 630 | 270 | CO2 | 200 | O2 | 10 | — | 0 | 2.3 |
| 63 | 500 | 7 | 300 | 325 | 507.5 | 217.5 | CO2 | 140 | O2 | 15 | — | 0 | 2.3 |
| 64 | 600 | 8 | 325 | 320 | 507.5 | 217.5 | CO2 | 200 | O2 | 10 | — | 0 | 2.3 |
| 65 | 750 | 8 | 350 | 325 | 700 | 300 | CO2 | 200 | O2 | 25 | — | 0 | 2.3 |
| 66 | 750 | 8 | 450 | 325 | 577.5 | 247.5 | CO2 | 200 | O2 | 25 | — | 0 | 2.3 |
| 67 | 450 | 6 | 300 | 320 | 620 | 155 | CO2 | 200 | O2 | 10 | — | 0 | 4.0 |
| 68 | 750 | 8 | 350 | 300 | 420 | 180 | CO2 | 200 | O2 | 10 | — | 0 | 2.3 |
| 69 | 750 | 8 | 350 | 300 | 420 | 180 | CO2 | 200 | — | 0 | — | 0 | 2.3 |
| 70 | 600 | 8 | 350 | 300 | 630 | 270 | CO2 | 200 | O2 | 10 | — | 0 | 2.3 |
| 71 | 750 | 8 | 350 | 325 | 630 | 270 | CO2 | 200 | O2 | 25 | — | 0 | 2.3 |
| 72 | 600 | 8 | 400 | 300 | 507.5 | 217.5 | CO2 | 200 | O2 | 10 | — | 0 | 2.3 |
| 73 | 450 | 6 | 325 | 320 | 507.5 | 217.5 | CO2 | 200 | O2 | 10 | — | 0 | 2.3 |
| 74 | 750 | 8 | 450 | 320 | 620 | 155 | CO2 | 200 | O2 | 25 | — | 0 | 4.0 |

TABLE 7C

Deposition Conditions for DEMS + CHO

| Run # | Power (Watts) | Pressure (torr) | Spacing (mils) | Temperature (C.) | CHO Flow (mg/min) | DEMS Flow (mg/min) | Carrier | Carrier (sccm) | Additive | Additive (sccm) | Additive 2 | Additive 2 (ssm) | CHO/DEMS ratio |
|---|---|---|---|---|---|---|---|---|---|---|---|---|---|
| 1 | 600 | 8 | 350 | 250 | 450 | 150 | CO2 | 200 | O2 | 10 | — | 0 | 3.0 |
| 2 | 600 | 8 | 350 | 250 | 450 | 150 | CO2 | 200 | O2 | 10 | — | 0 | 3.0 |
| 3 | 350 | 8 | 350 | 225 | 450 | 150 | He | 190 | O2 | 20 | — | 0 | 3.0 |
| 4 | 600 | 8 | 350 | 225 | 450 | 150 | He | 210 | — | 0 | — | 0 | 3.0 |
| 5 | 600 | 8 | 350 | 225 | 450 | 150 | He | 210 | — | 0 | — | 0 | 3.0 |
| 6 | 450 | 8 | 350 | 225 | 450 | 150 | He | 200 | O2 | 10 | — | 0 | 3.0 |
| 7 | 450 | 8 | 350 | 225 | 450 | 150 | He | 200 | O2 | 10 | — | 0 | 3.0 |

TABLE 7C-continued

Deposition Conditions for DEMS + CHO

| Run # | Power (Watts) | Pressure (torr) | Spacing (mils) | Temperature (C.) | CHO Flow (mg/min) | DEMS Flow (mg/min) | Carrier | Carrier (sccm) | Additive | Additive (sccm) | Additive 2 | Additive 2 (ssm) | CHO/DEMS ratio |
|---|---|---|---|---|---|---|---|---|---|---|---|---|---|
| 8  | 450 | 10 | 350 | 225 | 450 | 150 | He | 210 | — | 0 | —  | 0   | 3.0 |
| 9  | 450 | 8  | 350 | 225 | 450 | 150 | He | 210 | — | 0 | Ar | 200 | 3.0 |
| 10 | 750 | 8  | 350 | 225 | 450 | 150 | He | 210 | — | 0 | —  | 0   | 3.0 |
| 11 | 450 | 8  | 350 | 225 | 450 | 150 | He | 210 | — | 0 | —  | 0   | 3.0 |
| 12 | 450 | 8  | 350 | 225 | 450 | 150 | He | 210 | — | 0 | —  | 0   | 3.0 |
| 13 | 600 | 8  | 350 | 225 | 450 | 150 | He | 420 | — | 0 | —  | 0   | 3.0 |
| 14 | 450 | 8  | 350 | 225 | 575 | 200 | He | 210 | — | 0 | —  | 0   | 2.9 |
| 15 | 450 | 6  | 350 | 225 | 450 | 150 | He | 210 | — | 0 | —  | 0   | 3.0 |
| 16 | 450 | 8  | 350 | 225 | 450 | 150 | He | 420 | — | 0 | —  | 0   | 3.0 |
| 17 | 450 | 8  | 350 | 225 | 450 | 150 | He | 420 | — | 0 | —  | 0   | 3.0 |
| 18 | 450 | 8  | 350 | 225 | 400 | 200 | He | 210 | — | 0 | —  | 0   | 2.0 |
| 19 | 450 | 8  | 350 | 225 | 700 | 250 | He | 210 | — | 0 | —  | 0   | 2.8 |
| 20 | 600 | 8  | 350 | 300 | 450 | 150 | He | 210 | — | 0 | —  | 0   | 3.0 |
| 21 | 600 | 8  | 350 | 300 | 450 | 150 | He | 210 | — | 0 | —  | 0   | 3.0 |

TABLE 7D

Deposition Conditions for DEMS + CHOx

| Run # | Power (Watts) | Pressure (torr) | Spacing (mils) | Temperature (C.) | CHOx Flow (mg/min) | DEMS Flow (mg/min) | Carrier | Carrier (sccm) | Additive | Additive (sccm) | Additive 2 | Additive 2 (ssm) | CHOx/DEMS ratio |
|---|---|---|---|---|---|---|---|---|---|---|---|---|---|
| 1 | 450 | 8  | 350 | 225 | 450 | 150 | He | 190 | O2 | 20 | — | 0 | 3.0 |
| 2 | 450 | 8  | 350 | 225 | 450 | 150 | He | 210 | —  | 0  | — | 0 | 3.0 |
| 3 | 450 | 8  | 350 | 225 | 400 | 130 | He | 210 | —  | 0  | — | 0 | 3.1 |
| 4 | 450 | 10 | 350 | 225 | 450 | 150 | He | 210 | —  | 0  | — | 0 | 3.0 |
| 5 | 450 | 6  | 350 | 225 | 450 | 150 | He | 210 | —  | 0  | — | 0 | 3.0 |
| 6 | 450 | 8  | 350 | 225 | 500 | 170 | He | 210 | —  | 0  | — | 0 | 2.9 |
| 7 | 450 | 8  | 350 | 225 | 450 | 150 | He | 420 | —  | 0  | — | 0 | 3.0 |
| 8 | 450 | 8  | 350 | 225 | 350 | 250 | He | 210 | —  | 0  | — | 0 | 1.4 |
| 9 | 600 | 8  | 350 | 300 | 450 | 150 | He | 210 | —  | 0  | — | 0 | 3.0 |

TABLE 8A

Film Properties for DEMS + ATRP

| Run # | RI (as dep'd) | RI (post-UV) | change in RI | d (nm, as-dep'd) | d (nm, post-UV) | % Shrinkage | k (post-UV) | Mod (GPa, post-UV) | H (GPa, post-UV) |
|---|---|---|---|---|---|---|---|---|---|
| 1  | 1.505 | 1.308 | −0.197 | 1046 | 699  | 33 | 2.04 | 1.71 | 0.09 |
| 2  | 1.511 | 1.308 | −0.203 | 1046 | 699  | 33 | 2.04 | 1.71 | 0.18 |
| 3  | 1.516 | 1.347 | −0.169 | 756  | 480  | 37 | 2.14 | 2.99 | 0.32 |
| 4  | 1.516 | 1.364 | −0.152 | 667  | 422  | 37 | 2.15 | 3.70 | 0.42 |
| 5  | 1.514 | 1.343 | −0.171 | 703  | 448  | 36 | 2.15 | 3.54 | 0.41 |
| 6  | 1.517 | 1.364 | −0.153 | 667  | 422  | 37 | 2.15 | 3.70 | 0.21 |
| 7  | 1.504 | 1.330 | −0.174 | 651  | 459  | 29 | 2.17 | 2.47 | 0.25 |
| 8  | 1.479 | 1.351 | −0.128 | 941  | 784  | 17 | 2.18 | 4.09 | 0.50 |
| 9  | 1.477 | 1.343 | −0.134 | 1003 | 884  | 12 | 2.21 | 4.32 | 0.62 |
| 10 | 1.510 | 1.374 | −0.136 | 1157 | 955  | 17 | 2.22 | 2.51 | 0.25 |
| 11 | 1.506 | 1.363 | −0.143 | 1151 | 919  | 20 | 2.25 | 3.30 | 0.40 |
| 12 | 1.492 | 1.350 | −0.142 | 848  | 719  | 15 | 2.25 | 5.64 | 0.76 |
| 13 | 1.505 | 1.356 | −0.149 | 654  | 423  | 35 | 2.26 | 3.50 | 0.40 |
| 14 | 1.456 | 1.324 | −0.132 | 727  | 613  | 16 | 2.29 | 5.44 | 0.69 |
| 15 | 1.478 | 1.349 | −0.129 | 1187 | 1037 | 13 | 2.29 | 6.53 | 0.95 |
| 16 | 1.482 | 1.345 | −0.137 | 1723 | 1529 | 11 | 2.29 | 3.74 | 0.57 |
| 17 | 1.503 | 1.351 | −0.152 | 499  | 414  | 17 | 2.30 |      |      |
| 18 | 1.466 | 1.363 | −0.103 | 946  | 767  | 19 | 2.30 | 9.37 | 1.32 |
| 19 | 1.483 | 1.344 | −0.139 | 1007 | 910  | 10 | 2.30 | 3.64 | 0.48 |
| 20 | 1.479 | 1.333 | −0.146 | 797  | 732  | 8  | 2.30 | 6.13 | 0.91 |
| 21 | 1.463 | 1.345 | −0.118 | 993  | 899  | 9  | 2.34 | 4.32 | 0.61 |
| 22 | 1.494 | 1.369 | −0.125 | 608  | 515  | 15 | 2.34 | 6.89 | 0.86 |
| 23 | 1.495 | 1.338 | −0.157 | 385  | 346  | 10 | 2.34 |      |      |
| 24 | 1.493 | 1.347 | −0.146 | 867  | 810  | 7  | 2.39 | 4.91 | 0.65 |
| 25 | 1.493 | 1.348 | −0.145 | 868  | 821  | 5  | 2.39 | 4.91 | 0.65 |
| 26 | 1.468 | 1.352 | −0.116 | 825  | 791  | 4  | 2.42 | 4.76 | 0.62 |
| 27 | 1.469 | 1.355 | −0.114 | 1081 | 1022 | 5  | 2.43 | 4.26 | 0.61 |
| 28 | 1.509 | 1.365 | −0.144 | 1035 | 925  | 11 | 2.44 | 3.90 | 0.47 |

TABLE 8A-continued

Film Properties for DEMS + ATRP

| Run # | RI (as dep'd) | RI (post-UV) | change in RI | d (nm, as-dep'd) | d (nm, post-UV) | % Shrinkage | k (post-UV) | Mod (GPa, post-UV) | H (GPa, post-UV) |
|---|---|---|---|---|---|---|---|---|---|
| 29 | 1.458 | 1.338 | −0.120 | 783 | 748 | 4 | 2.44 | 5.87 | 0.90 |
| 30 | 1.467 | 1.328 | −0.139 | 418 | 385 | 8 | 2.46 | | |
| 31 | 1.452 | 1.338 | −0.114 | 463 | 435 | 6 | 2.46 | | |
| 32 | 1.476 | 1.364 | −0.112 | 1041 | 987 | 5 | 2.47 | 4.28 | 0.54 |
| 33 | 1.479 | 1.362 | −0.117 | 487 | 402 | 17 | 2.48 | 6.90 | 0.95 |
| 34 | 1.444 | 1.341 | −0.103 | 557 | 503 | 10 | 2.50 | 10.30 | 1.51 |
| 35 | 1.492 | 1.378 | −0.114 | 899 | 842 | 6 | 2.50 | 6.10 | 0.84 |
| 36 | 1.492 | 1.378 | −0.114 | 824 | 786 | 5 | 2.50 | 6.10 | 0.84 |
| 37 | 1.488 | 1.367 | −0.121 | 947 | 888 | 6 | 2.50 | 4.90 | 0.58 |
| 38 | 1.467 | 1.369 | −0.098 | 899 | 858 | 5 | 2.51 | 7.55 | 1.15 |
| 39 | 1.494 | 1.400 | −0.094 | 1048 | 954 | 9 | 2.53 | 4.16 | 0.48 |
| 40 | 1.450 | 1.357 | −0.093 | 1013 | 993 | 2 | 2.54 | 5.85 | 0.85 |
| 41 | 1.467 | 1.371 | −0.096 | 755 | 694 | 8 | 2.55 | 9.25 | 1.34 |
| 42 | 1.447 | 1.339 | −0.108 | 696 | 676 | 3 | 2.56 | 7.43 | 1.12 |
| 43 | 1.485 | 1.392 | −0.093 | 1214 | 1174 | 3 | 2.56 | 4.08 | 0.47 |
| 44 | 1.434 | 1.346 | −0.088 | 743 | 734 | 1 | 2.56 | 7.19 | 1.11 |
| 45 | 1.502 | 1.381 | −0.121 | 1313 | 1223 | 7 | 2.57 | 3.46 | 0.36 |
| 46 | 1.490 | 1.390 | −0.100 | 1300 | 1245 | 4 | 2.58 | 3.64 | 0.40 |
| 47 | 1.423 | 1.366 | −0.057 | 359 | 330 | 8 | 2.60 | | |
| 48 | 1.467 | 1.366 | −0.101 | 706 | 683 | 3 | 2.60 | 7.38 | 1.04 |

TABLE 8B

Film Properties for DEMS + LIMO

| Run # | RI (as dep'd) | RI (post-UV) | change in RI | d (nm, as-dep'd) | d (nm, post-UV) | % Shrinkage | k (post-UV) | Mod (GPa, post-UV) | H (GPa, post-UV) |
|---|---|---|---|---|---|---|---|---|---|
| 1 | 1.504 | 1.318 | −0.186 | 898 | 741 | 17 | 2.12 | 3.26 | 0.41 |
| 2 | 1.511 | 1.335 | −0.176 | 902 | 712 | 21 | 2.12 | 1.98 | 0.14 |
| 3 | 1.517 | 1.338 | −0.179 | 465 | 346 | 26 | 2.13 | 6.40 | 0.74 |
| 4 | 1.510 | 1.332 | −0.178 | 859 | 724 | 16 | 2.14 | 2.58 | 0.28 |
| 5 | 1.516 | 1.361 | −0.155 | 916 | 712 | 22 | 2.15 | 2.50 | 0.25 |
| 6 | 1.471 | 1.318 | −0.153 | 494 | 408 | 17 | 2.19 | 2.75 | 0.28 |
| 7 | 1.512 | 1.362 | −0.150 | 949 | 726 | 23 | 2.20 | 2.49 | 0.24 |
| 8 | 1.514 | 1.371 | −0.143 | 817 | 597 | 27 | 2.22 | 2.62 | 0.24 |
| 9 | 1.506 | 1.337 | −0.169 | 1305 | 869 | 33 | 2.23 | | |
| 10 | 1.500 | 1.317 | −0.183 | 1445 | 1000 | 31 | 2.23 | 2.60 | 0.32 |
| 11 | 1.524 | 1.386 | −0.138 | 560 | 315 | 44 | 2.26 | 4.10 | 0.43 |
| 12 | 1.516 | 1.351 | −0.165 | 885 | 750 | 15 | 2.26 | 2.48 | 0.22 |
| 13 | 1.480 | 1.309 | −0.171 | 1703 | 1269 | 25 | 2.29 | 3.61 | 0.55 |
| 14 | 1.511 | 1.410 | −0.101 | 1011 | 769 | 24 | 2.29 | 2.63 | 0.28 |
| 15 | 1.484 | 1.355 | −0.129 | 1396 | 1251 | 10 | 2.31 | 3.15 | 0.55 |
| 16 | 1.523 | 1.388 | −0.135 | 963 | 610 | 37 | 2.32 | 2.72 | 0.25 |
| 17 | 1.485 | 1.366 | −0.119 | 1112 | 917 | 18 | 2.33 | 4.35 | 0.61 |
| 18 | 1.478 | 1.332 | −0.146 | 811 | 669 | 18 | 2.33 | 4.44 | 0.58 |
| 19 | 1.494 | 1.363 | −0.131 | 1454 | 1300 | 11 | 2.33 | 3.30 | 0.44 |
| 20 | 1.502 | 1.298 | −0.204 | 420 | 349 | 17 | 2.34 | 7.70 | 0.92 |
| 21 | 1.479 | 1.378 | −0.101 | 1044 | 855 | 18 | 2.34 | 2.34 | 0.91 |
| 22 | 1.500 | 1.353 | −0.147 | 986 | 821 | 17 | 2.34 | | |
| 23 | 1.503 | 1.330 | −0.173 | 1316 | 1131 | 14 | 2.34 | 3.20 | 0.44 |
| 24 | 1.527 | 1.410 | −0.117 | 1080 | 774 | 28 | 2.35 | 2.66 | 0.20 |
| 25 | 1.467 | 1.302 | −0.165 | 1117 | 848 | 24 | 2.36 | 5.30 | 0.83 |
| 26 | 1.471 | 1.315 | −0.156 | 966 | 741 | 23 | 2.36 | 4.40 | 0.69 |
| 27 | 1.471 | 1.315 | −0.156 | 966 | 741 | 23 | 2.36 | 3.40 | 0.51 |
| 28 | | 1.362 | 1.362 | 1500 | 1235 | 18 | 2.36 | 5.09 | 0.75 |
| 29 | 1.478 | 1.356 | −0.122 | 1297 | 1181 | 9 | 2.37 | 3.94 | 0.57 |
| 30 | 1.475 | 1.343 | −0.132 | 1301 | 1179 | 9 | 2.37 | 4.45 | 0.66 |
| 31 | 1.541 | 1.422 | −0.119 | 1171 | 764 | 35 | 2.38 | 3.00 | 0.28 |
| 32 | 1.469 | 1.334 | −0.135 | 962 | 849 | 12 | 2.38 | 4.71 | 0.68 |
| 33 | 1.483 | 1.355 | −0.128 | 824 | 662 | 20 | 2.38 | 5.70 | 0.78 |
| 34 | 1.465 | 1.335 | −0.130 | 1014 | 900 | 11 | 2.39 | 4.48 | 0.65 |
| 35 | 1.490 | 1.358 | −0.132 | 1569 | 1379 | 12 | 2.40 | 3.38 | 0.44 |
| 36 | 1.501 | 1.351 | −0.150 | 1479 | 1318 | 11 | 2.40 | 3.38 | 0.44 |
| 37 | 1.464 | 1.299 | −0.165 | 1076 | 856 | 20 | 2.40 | 4.50 | 0.72 |
| 38 | 1.514 | 1.414 | −0.100 | 665 | 478 | 28 | 2.40 | 3.65 | 0.34 |
| 39 | 1.497 | 1.410 | −0.087 | 1164 | 951 | 18 | 2.41 | 4.34 | 0.59 |
| 40 | 1.450 | 1.341 | −0.109 | 1194 | 1104 | 8 | 2.42 | 4.13 | 0.56 |
| 41 | 1.465 | 1.321 | −0.144 | 976 | 796 | 18 | 2.43 | 4.00 | 0.61 |
| 42 | 1.461 | 1.338 | −0.123 | 1223 | 1149 | 6 | 2.43 | 4.45 | 0.65 |
| 43 | 1.475 | 1.342 | −0.133 | 1172 | 1085 | 7 | 2.43 | 4.45 | 0.65 |

TABLE 8B-continued

Film Properties for DEMS + LIMO

| Run # | RI (as dep'd) | RI (post-UV) | change in RI | d (nm, as-dep'd) | d (nm, post-UV) | % Shrinkage | k (post-UV) | Mod (GPa, post-UV) | H (GPa, post-UV) |
|---|---|---|---|---|---|---|---|---|---|
| 44 | 1.445 | 1.323 | −0.122 | 1018 | 937 | 8 | 2.44 | 5.32 | 0.87 |
| 45 | 1.543 | 1.449 | −0.094 | 1287 | 779 | 39 | 2.44 | 3.74 | 0.41 |
| 46 |  | 1.351 | 1.351 | 851 | 733 | 14 | 2.45 | 7.42 | 1.11 |
| 47 |  | 1.351 | 1.351 | 640 | 524 | 18 | 2.45 | 9.01 | 1.22 |
| 48 | 1.479 | 1.337 | −0.142 | 878 | 714 | 19 | 2.45 | 7.98 | 1.16 |
| 49 | 1.454 | 1.341 | −0.113 | 920 | 839 | 9 | 2.45 | 5.55 | 0.87 |
| 50 | 1.482 | 1.356 | −0.126 | 1479 | 1371 | 7 | 2.46 | 3.70 | 0.54 |
| 51 | 1.464 | 1.349 | −0.115 | 1188 | 1113 | 6 | 2.46 | 5.64 | 0.88 |
| 52 | 1.490 | 1.355 | −0.135 | 1253 | 1149 | 8 | 2.46 | 3.80 | 0.55 |
| 53 | 1.464 | 1.349 | −0.115 | 1043 | 996 | 5 | 2.49 | 5.26 | 0.83 |
| 54 |  | 1.348 | 1.348 | 1117 | 976 | 13 | 2.49 | 7.05 | 1.13 |
| 55 | 1.460 | 1.345 | −0.115 | 1303 | 1227 | 6 | 2.50 | 4.87 | 0.74 |
| 56 | 1.448 | 1.360 | −0.088 | 955 | 896 | 6 | 2.52 | 6.74 | 1.07 |
| 57 | 1.509 | 1.389 | −0.120 | 1689 | 1468 | 13 | 2.52 | 3.13 | 0.36 |
| 58 | 1.443 | 1.330 | −0.113 | 1058 | 1009 | 5 | 2.52 | 4.94 | 0.74 |
| 59 |  | 1.396 | 1.396 | 1031 | 862 | 16 | 2.52 | 9.65 | 1.41 |
| 60 | 1.495 | 1.407 | −0.088 | 596 | 476 | 20 | 2.53 | 3.95 | 0.40 |
| 61 | 1.459 | 1.306 | −0.153 | 830 | 690 | 17 | 2.53 | 8.69 | 1.28 |
| 62 | 1.435 | 1.331 | −0.104 | 741 | 702 | 5 | 2.54 | 6.88 | 1.11 |
| 63 |  | 1.355 | 1.355 | 852 | 727 | 15 | 2.55 | 12.50 | 1.10 |
| 64 |  | 1.366 | 1.366 | 1055 | 901 | 15 | 2.55 | 10.45 | 1.61 |
| 65 | 1.445 | 1.362 | −0.083 | 1143 | 1085 | 5 | 2.55 | 7.31 | 1.19 |
| 66 |  | 1.375 | 1.375 | 1075 | 983 | 9 | 2.56 | 12.46 | 1.61 |
| 67 |  | 1.355 | 1.355 | 773 | 677 | 12 | 2.56 | 10.99 | 1.65 |
| 68 | 1.535 | 1.488 | −0.047 | 1114 | 660 | 41 | 2.58 | 3.32 | 0.25 |
| 69 | 1.540 | 1.461 | −0.079 | 807 | 536 | 34 | 2.58 | 3.84 |  |
| 70 | 1.438 | 1.343 | −0.095 | 654 | 629 | 4 | 2.59 | 7.16 | 1.13 |
| 71 | 1.454 | 1.348 | −0.106 | 1200 | 1138 | 5 | 2.59 | 6.13 | 0.98 |
| 72 |  | 1.336 | 1.336 | 864 | 785 | 9 | 2.59 | 8.61 | 1.35 |
| 73 |  | 1.374 | 1.374 | 734 | 641 | 13 | 2.60 | 11.53 | 1.71 |
| 74 |  | 1.367 | 1.367 | 966 | 892 | 8 | 2.60 | 8.94 | 1.42 |

TABLE 8C

Film Properties for DEMS + CHO

| Run # | RI (as dep'd) | RI (post-UV) | change in RI | d (nm, as-dep'd) | d (nm, post-UV) | % Shrinkage | k (post-UV) | Mod (GPa, post-UV) | H (GPa, post-UV) |
|---|---|---|---|---|---|---|---|---|---|
| 1 | 1.485 | 1.339 | −0.146 | 1538 | 1237 | 20 | 2.30 |  |  |
| 2 | 1.487 | 1.340 | −0.147 | 1568 | 1264 | 19 | 2.30 |  |  |
| 3 | 1.456 | 1.322 | −0.134 | 1008 | 764 | 24 | 2.30 | 3.52 | 0.36 |
| 4 | 1.502 | 1.350 | −0.152 | 1018 | 760 | 25 | 2.36 | 5.48 | 0.83 |
| 5 | 1.504 | 1.388 | −0.116 | 1364 | 1018 | 25 | 2.36 | 5.48 | 0.83 |
| 6 | 1.472 | 1.342 | −0.130 | 947 | 689 | 27 | 2.37 | 6.34 | 0.95 |
| 7 | 1.476 | 1.355 | −0.121 | 1233 | 890 | 28 | 2.37 | 6.34 | 0.95 |
| 8 | 1.464 | 1.320 | −0.144 | 807 | 625 | 23 | 2.40 | 5.69 | 0.92 |
| 9 | 1.489 | 1.352 | −0.137 | 814 | 641 | 21 | 2.44 | 5.79 | 0.81 |
| 10 | 1.533 | 1.385 | −0.148 | 1158 | 923 | 20 | 2.47 | 4.22 | 0.60 |
| 11 | 1.478 | 1.347 | −0.131 | 676 | 486 | 28 | 2.49 | 9.01 | 1.33 |
| 12 | 1.475 | 1.360 | −0.115 | 914 | 654 | 28 | 2.49 | 9.01 | 1.33 |
| 13 | 1.494 | 1.375 | −0.119 | 829 | 672 | 19 | 2.51 | 6.26 | 0.94 |
| 14 | 1.457 | 1.328 | −0.129 | 825 | 659 | 20 | 2.52 | 7.63 | 1.24 |
| 15 | 1.474 | 1.368 | −0.106 | 548 | 431 | 21 | 2.52 | 7.12 | 1.02 |
| 16 | 1.465 | 1.346 | −0.119 | 535 | 420 | 21 | 2.56 | 8.50 | 1.26 |
| 17 | 1.477 | 1.387 | −0.090 | 801 | 607 | 24 | 2.56 | 8.50 | 1.26 |
| 18 | 1.459 | 1.350 | −0.109 | 682 | 563 | 17 | 2.56 | 8.30 | 1.27 |
| 19 | 1.447 | 1.348 | −0.099 | 918 | 755 | 18 | 2.60 | 8.13 | 1.34 |
| 20 | 1.514 | 1.396 | −0.118 | 1131 | 1061 | 6 | 2.60 | 4.91 | 0.64 |
| 21 | 1.507 | 1.436 | −0.071 | 1291 | 1155 | 11 | 2.60 | 4.91 | 0.64 |

TABLE 8D

Film Properties for DEMS + CHOx

| Run # | RI (as dep'd) | RI (post-UV) | change in RI | d (nm, as-dep'd) | d (nm, post-UV) | % Shrinkage | k (post-UV) | Mod (GPa, post-UV) | H (GPa, post-UV) |
|---|---|---|---|---|---|---|---|---|---|
| 1 | 1.481 | 1.334 | −0.147 | 1548 | 1048 | 32 | 2.21 | 3.60 | 0.48 |
| 2 | 1.499 | 1.327 | −0.172 | 1086 | 690 | 36 | 2.29 | 4.20 | 0.61 |

TABLE 8D-continued

Film Properties for DEMS + CHOx

| Run # | RI (as dep'd) | RI (post-UV) | change in RI | d (nm, as-dep'd) | d (nm, post-UV) | % Shrinkage | k (post-UV) | Mod (GPa, post-UV) | H (GPa, post-UV) |
|---|---|---|---|---|---|---|---|---|---|
| 3 | 1.505 | 1.338 | −0.167 | 1033 | 649 | 37 | 2.29 | 2.60 | 0.24 |
| 4 | 1.493 | 1.325 | −0.168 | 1236 | 756 | 39 | 2.31 | 3.70 | 0.54 |
| 5 | 1.495 | 1.366 | −0.129 | 881 | 612 | 31 | 2.31 | 5.10 | 0.71 |
| 6 | 1.490 | 1.336 | −0.154 | 1438 | 958 | 33 | 2.35 | 3.20 | 0.39 |
| 7 | 1.497 | 1.331 | −0.166 | 891 | 624 | 30 | 2.40 | 5.20 | 0.77 |
| 8 | 1.471 | 1.357 | −0.114 | 1234 | 935 | 24 | 2.48 | 6.10 | 0.97 |
| 9 | 1.522 | 1.404 | −0.118 | 1411 | 1253 | 11 | 2.50 | 3.90 | 0.55 |

The invention claimed is:

1. A chemical vapor deposition method for forming a porous organosilicate glass film on a substrate, the method comprising the steps of:

introducing gaseous reagents comprising a precursor mixture, said precursor mixture comprising at least one organosilane and/or organosiloxane precursor and a porogen precursor having a structure selected from the group consisting of:

(a) a hydrocarbon structure containing one or more alcohol groups and having the general formula $C_nH_{2n+2-2x-2y-z}(OH)_z$ where n=1-12, and where x is the number of cyclic rings in the structure and is between 0 and 4, and where y is the number of unsaturated bonds in the structure and is between 0 and n, and where z is the number of alcohol groups in the structure and is between 1 and 4, and where the alcohol groups can be exocyclic and/or endocyclic;

(b) a hydrocarbon structure containing one or more ether linkages and having the general formula $C_nH_{2n+2-2x-2y}O_z$ where n=1-12, and where x is the number of cyclic rings in the structure and is between 0 and 4, and where y is the number of unsaturated bonds in the structure and is between 0 and n, and where z is the number of ether linkages in the structure and is between 1 and 4, and where the ether linkage(s) can be exo- and/or endocyclic;

(c) a hydrocarbon structure containing one or more epoxide groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of epoxide groups in the structure and is between 1 and 4, and where the epoxide groups can be attached to a cyclic ring or a linear chain;

(d) a hydrocarbon structure containing one or more aldehyde groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4;

(e) a hydrocarbon structure containing one or more ketone groups and having the general formula $C_nH_{2n+2-2x-2y-2z}(O)_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4, and where the ketone group(s) can be exo- and/or endocyclic;

(f) a hydrocarbon structure containing one or more carboxylic acid groups and having the general formula $C_nH_{2n+2-2x-2y-3z}(OOH)_z$ where n=1-12, and where x is the number of cyclic rings in the structure and is between 0 and 4, and where y is the number of unsaturated bonds in the structure and is between 0 and n, and where z is the number of carboxylic acid groups in the structure and is between 1 and 4;

(g) a hydrocarbon structure containing an even number of carboxylic acid groups and in which the carboxylic acid is dehydrated to form a cyclic anhydride group where the structure has the general formula $C_nH_{2n+2-2x-2y-6z}(O_3)_z$ where n=1-12, and where x is the number of cyclic rings in the structure and is between 0 and 4, and where y is the number of unsaturated bonds in the structure and is between 0 and n, and where z is the number of anhydride groups in the structure and is 1 or 2;

(h) a hydrocarbon structure containing an ester group with the general formula $C_nH_{2n+2-2x-2y-2z}(O_2)_z$ where n=1-12, and where x is the number of cyclic rings in the structure and is between 0 and 4, and where y is the number of unsaturated bonds in the structure, and where none of the unsaturated bonds are conjugated with the carbonyl group of the ester, and where z is the number of anhydride groups in the structure and is 1 or 2;

(i) a hydrocarbon structure containing an acrylate functionality consisting of an ester group and at least one unsaturated bond that is conjugated with the carbonyl of the ester group, and having the general formula $C_nH_{2n+2-2x-2y-2z}(O_2)_z$ where n=1-12, and where x is the number of cyclic rings in the structure and is between 0 and 4, and where y is the number of unsaturated bonds in the structure and is greater than or equal to 1, and where at least of the unsaturated bonds are conjugated with the carbonyl group of the ester, and where z is the number of ester groups in the structure and is 1 or 2;

(j) a hydrocarbon structure containing any combination of functional groups selected from the following list: alcohol, ether, carbonyl, and carboxylic acid and having the general formula $C_nH_{2n+2-2u-2v-w-2y-3z}(OH)_w(O)_x(O)_y(OOH)_z$ where n=1-12, and where u is the number of cyclic rings in the structure and is between 0 and 4, and where v is the number of unsaturated bonds in the structure and is between 0 and n, and where w is the number of alcohol groups in the structure and is between 0 and 4, and where x is the number of ether linkages in the structure and is between 0 and 4 and where the ether linkage(s) can be endocyclic or exocyclic, and where y is the number of carbonyl groups in the structure and is between 0 and 3 in which the carbonyl group can be ketones and/or aldehydes, and where z is the number of carboxylic acid groups in the structure and is between 0 and 2;

(k) a hydrocarbon structure containing one or more primary amine groups and having the general formula $C_nH_{2n+2-2x-2y-2z}(NH_2)_z$ where n=1-12, and where x is the number of cyclic rings in the structure and is between 0 and 4, and where y is the number of unsaturated bonds in the structure and is between 0 and n, and where z is the number of amine groups in the structure and is between 1 and 4, and where the primary amine groups can be exo- and/or endocyclic;

(l) a hydrocarbon structure containing one or more secondary amine groups and having the general formula $C_nH_{2n+2-2x-2y-2z}(NH)_z$ where n=1-12, and where x is the number of cyclic rings in the structure and is between 0 and 4, and where y is the number of unsaturated bonds in the structure and is between 0 and n, and where z is the number of secondary amine groups in the structure and is between 1 and 4, and where the secondary amine groups can be exo- and/or endocyclic;

(m) a hydrocarbon structure containing one or more tertiary amine groups and having the general formula $C_nH_{2n+2-2x-2y-3z}(N)_z$ where n=1-12, and where x is the number of cyclic rings in the structure and is between 0 and 4, and where y is the number of unsaturated bonds in the structure and is between 0 and n, and where z is the number of tertiary amine groups in the structure and is between 1 and 4, and where the tertiary amine groups can be exo- and/or endocyclic;

(n) a hydrocarbon structure containing one or more nitro groups and having the general formula $C_nH_{2n+2-2x-2y-z}(NO_2)_z$ where n=1-12, and where x is the number of cyclic rings in the structure and is between 0 and 4, and where y is the number of unsaturated bonds in the structure and is between 0 and n, and where z is the number of nitro groups in the structure and is between 1 and 4, and where the nitro groups can be exo- and/or endocyclic;

(o) a hydrocarbon structure having at least one amine functional group and ether linkage and having the general formula $C_nH_{2n+2-2u-2v-w-2x-3y-z}(NH_2)_w(NH)_x(N)_y(O)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of ether linkages in the structure and is between 1 and 4, and where the ether linkage(s) and/or amine group(s) can be exo- and/or endocyclic;

(p) a hydrocarbon structure having both amine and alcohol groups and having the general formula $C_nH_{2n+2-2u-2v-w-2x-3y-z}(NH_2)_w(NH)_x(N)_y(OH)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of alcohol groups in the structure and is between 1 and 4, and where the alcohol and/or amine groups can be exo- and/or endocyclic;

(q) and mixtures thereof;

applying energy to the gaseous reagents to induce reaction of the gaseous reagents and provide a preliminary film, wherein the preliminary film comprises a porogen derived from said porgen precursor; and removing at least a portion of the porogen from the preliminary film to provide the porous organosilicate class film, wherein said porous organosilicate glass film has a dielectric constant less than 2.7.

2. The method of claim 1, wherein the dielectric constant is less than 1.9.

3. The method of claim 1, wherein the porous organosilicate glass film comprises a compound of the formula $Si_vO_wC_xH_yF_z$, where v+w+x+y+z=100 atomic %, v is from 20 to 30 atomic %, w is from 20 to 45 atomic %, x is from 5 to 20 atomic %, y is from 15 to 40 atomic %, and z is 0 to 15 atomic %.

4. The method of claim 1, wherein said removing step involves treating said preliminary film with at least one fluorination agent selected from the group consisting of $SiF_4$, $NF_3$, $F_2$, $COF_2$, $CO_2F_2$ and HF is used to introduce F to the porous organosilicate glass film, and substantially all F in the porous film is bonded to Si in Si—F groups.

5. The method of claim 1, wherein 50% or greater of the hydrogen in the porous organosilicate glass film is bonded to carbon.

6. The method of claim 1, wherein the porous organosilicate glass film has a density less than 1.5 g/ml.

7. The method of claim 1, wherein the porous organosilicate glass film comprises pores having an equivalent spherical diameter less than or equal to 3 nm.

8. The method of claim 1, wherein a Fourier transform infrared (FTIR) spectrum of the porous film is substantially identical to a reference FTIR of a reference film prepared by a process substantially identical to the method except for a lack of any porogen precursors in the gaseous reagents.

9. The method of claim 8, wherein the porous film has a dielectric constant at least 0.3 less than a reference film prepared by a process substantially identical to the method except for a lack of any porogen precursors in the gaseous reagents.

10. The method of claim 8, wherein the porous film has a dielectric constant at least 10% less than a reference film prepared by a process substantially identical to the method except for a lack of any porogen precursors in the gaseous reagents.

11. The method of claim 1, wherein the porous film has an average weight loss of less than 1.0 wt %/hr isothermal at 425° C. under $N_2$.

12. The method of claim 1, wherein the porous film has an average weight loss of less than 1.0 wt %/hr isothermal at 425° C. under air.

13. The method of claim 1, wherein the porogen precursor is distinct from the at least one organosilane and/or organosiloxane precursor.

14. The method of claim 13, wherein the at least one organosilane and/or organosiloxane precursor is represented by the formula $SiR^1_n(OR^2)_p(O(O)CR^3)_{4-(n+p)}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3.

15. The method of claim 13, wherein the at least one organosilane and/or organosiloxane precursor is represented by the formula $R^1{}_n(OR^2)_p(O(O)CR^4)_{3-n-p}Si—O—SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, $n+m \geq 1$, $n+p \leq 3$ and $m+q \leq 3$.

16. The method of claim 13, wherein the at least one organosilane and/or organosiloxane precursor is represented by the formula $R^1{}_n(OR^2)_p(O(O)CR^4)_{3-n-p}Si—SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, $n+m \geq 1$, $n+p \leq 3$ and $m+q \leq 3$.

17. The method of claim 13, wherein the at least one organosilane and/or organosiloxane precursor is represented by the formula $R^1{}_n(OR^2)_p(O(O)CR^4)_{3-n-p}Si—R^7—SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, $R^7$ is $C_2$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, and $n+m \geq 1$, and $n+p \leq 3$, and $m+q \leq 3$.

18. The method of claim 13, wherein the at least one organosilane and/or organosiloxane precursor is represented by the formula $(R^1{}_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, and $n+p \leq 4$.

19. The method of claim 13, wherein the at least one organosilane and/or organosiloxane precursor is represented by the formula $(R^1{}_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, and $n+p \leq 4$.

20. The method of claim 13, wherein the at least one organosilane and/or organosiloxane precursor is represented by cyclic silazanes of the formula $(N(R^1)Si(R^1R^2))_x$, where $R^1$ and $R^2$ are independently H, $C_1$ to $C_4$, linear or branched, saturated, singly or multiply unsaturated, cyclic, partially or fully fluorinated, and x may be any integer from 2 to 8.

21. The method of claim 13, wherein the at least one organosilane and/or organosiloxane precursor is represented by cyclic carbosilanes of the formula $(C(R^1R^2)Si(R^1R^2))_x$, where $R^1$ and $R^2$ are independently H, $C_1$ to $C_4$, linear or branched, saturated, singly or multiply unsaturated, cyclic, partially or fully fluorinated, and x may be any integer from 2 to 8, provided there is at least one Si—H bond in the cyclic carbosilanes.

22. The method of claim 13, wherein the at least one organosilane and/or organosiloxane precursor is a member selected from the group consisting of dimethoxymethylsilane, diethoxymethylsilane, di-isopropoxymethylsilane, di-tert-butoxymethylsilane, trimethoxysilane, triethoxysilane, tri-isopropoxysilane, methyltrimethoxysilane, methyltrimethoxysilane, and tri-tert-butoxysilane.

23. The method of claim 1, wherein said at least one organosilane and/or organosiloxane precursor is a mixture of a first silicon-containing precursor with two or fewer Si—O bonds with a second silicon-containing precursor with three or more Si—O bonds, and the mixture is provided to tailor a chemical composition of the porous film.

24. The method of claim 13, wherein the porogen precursor has a hydrocarbon structure containing one or more alcohol groups and having the general formula $C_nH_{2n+2-2x-2y-z}(OH)_z$ where n=1-12, and where x is the number of cyclic rings in the structure and is between 0 and 4, and where y is the number of unsaturated bonds in the structure and is between 0 and n, and where z is the number of alcohol groups in the structure and is between 1 and 4, and where the alcohol functionality hydroxyl group can be exo- and/or endocyclic.

25. The method of claim 13, wherein the porogen precursor has a hydrocarbon structure containing one or more ether linkages and having the general formula $C_nH_{2n+2-2x-2y}O_z$ where n=1-12, and where x is the number of cyclic rings in the structure and is between 0 and 4, and where y is the number of unsaturated bonds in the structure and is between 0 and n, and where z is the number of ether linkages in the structure and is between 1 and 4, and where the ether linkage(s) can be exo- and/or endocyclic.

26. The method of claim 13, wherein the porogen precursor has a hydrocarbon structure containing one or more epoxide groups and having the general formula $C_nH_{2n+2-2-2x-2y-2z}O_z$ where n=1-12, and where x is the number of cyclic rings in the structure and is between 0 and 4, and where y is the number of unsaturated bonds in the structure and is between 0 and n, and where z is the number of epoxide groups in the structure and is between 1 and 4, and where the epoxide groups can be attached to a cyclic ring or a linear chain.

27. The method of claim 13, wherein the porogen precursor has a hydrocarbon structure containing one or more aldehyde groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4.

28. The method of claim 13, wherein the porogen precursor has a hydrocarbon structure containing one or more ketone groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4, and where the ketone group(s) can be exo- and/or endocyclic.

29. The method of claim 13, wherein the porogen precursor has a hydrocarbon structure containing one or more carboxylic acid groups and having the general formula $C_nH_{2n+2-2x-2y-3z}(OOH)_z$ where n=1-12, and where x is the number of cyclic rings in the structure and is between 0 and 4, and where y is the number of unsaturated bonds in the structure and is between 0 and n, and where z is the number of carboxylic acid groups in the structure and is between 1 and 4.

30. The method of claim 13, wherein the porogen precursor has a hydrocarbon structure containing an even number of carboxylic acid groups that are dehydrated to form a cyclic anhydride group where the structure has the general formula $C_nH_{2n+2-2x-2y-6z}(O_3)_z$ where n=1-12, and where x is the number of cyclic rings in the structure and is between 0 and 4, and where y is the number of unsaturated bonds in the structure and is between 0 and n, and where z is the number of anhydride groups in the structure and is 1 or 2.

31. The method of claim 13, wherein the porogen precursor has a hydrocarbon structure containing an ester group with the general formula $C_nH_{2n+2-2x-2y-2z}(O_2)_z$ where n=1-12, and where x is the number of cyclic rings in the structure and is between 0 and 4, and where y is the number of unsaturated bonds in the structure, and where none of the unsaturated bonds are conjugated with the carbonyl group of the ester, and where z is the number of anhydride groups in the structure and is 1 or 2.

32. The method of claim 13, wherein the porogen precursor has a hydrocarbon structure containing an acrylate functionality consisting of an ester group and at least one unsaturated bond that is conjugated with the carbonyl of the ester group, and has the general formula $C_nH_{2n+2-2x-2y-2z}(O_2)_z$ where n=1-12, and where x is the number of cyclic rings in the structure and is between 0 and 4, and where y is the number of unsaturated bonds in the structure and is greater than or equal to 1, and where at least of the unsaturated bonds are conjugated with the carbonyl group of the ester, and where z is the number of ester groups in the structure and is 1 or 2.

33. The method of claim 13, wherein the porogen precursor has a hydrocarbon structure containing any combination of functional groups selected from the the group consisting of: alcohol, ether, carbonyl, and carboxylic acid and has the general formula $C_nH_{2n+2-2u-2v-w-2y-3z}(OH)_w(O)_x(O)_y(OOH)_z$ where n=1-12, and where u is the number of cyclic rings in the structure and is between 0 and 4, and where v is the number of unsaturated bonds in the structure and is between 0 and n, and where w is the number of alcohol groups in the structure and is between 0 and 4, and where x is the number of ether linkages in the structure and is between 0 and 4 and where the ether linkage(s) can be endocyclic or exocyclic, and where y is the number of carbonyl groups in the structure and is between 0 and 3 in which the carbonyl group can be ketones and/or aldehydes, and where z is the number of carboxylic acid groups in the structure and is between 0 and 2.

34. The method of claim 13, wherein the porogen precursor has a hydrocarbon structure containing one or more primary amine groups and has the general formula $C_nH_{2n+2-2x-2y-z}(NH_2)_z$ where n=1-12, and where x is the number of cyclic rings in the structure and is between 0 and 4, and where y is the number of unsaturated bonds in the structure and is between 0 and n, and where z is the number of amine groups in the structure and is between 1 and 4, and where the primary amine groups can be exo- and/or endocyclic.

35. The method of claim 13, wherein the porogen precursor has a hydrocarbon structure containing one or more secondary amine groups and has the general formula $C_nH_{2n+2-2x-2y-2z}(NH)_z$ where n=1-12, and where x is the number of cyclic rings in the structure and is between 0 and 4, and where y is the number of unsaturated bonds in the structure and is between 0 and n, and where z is the number of secondary amine groups in the structure and is between 1 and 4, and where the secondary amine groups can be exo- and/or endocyclic.

36. The method of claim 13, wherein the porogen precursor has a hydrocarbon structure containing one or more tertiary amine groups and has the general formula $C_nH_{2n+2-2x-2y-3z}(N)_z$ where n=1-12, and where x is the number of cyclic rings in the structure and is between 0 and 4, and where y is the number of unsaturated bonds in the structure and is between 0 and n, and where z is the number of tertiary amine groups in the structure and is between 1 and 4, and where the tertiary amine groups can be exo- and/or endocyclic.

37. The method of claim 13, wherein the porogen precursor has a hydrocarbon structure containing one or more nitro groups and having the general formula $C_nH_{2n+2-2x-2y-z}(NO_2)_z$ where n=1-12, and where x is the number of cyclic rings in the structure and is between 0 and 4, and where y is the number of unsaturated bonds in the structure and is between 0 and n, and where z is the number of nitro groups in the structure and is between 1 and 4, and where the nitro groups can be exo- and/or endocyclic.

38. The method of claim 13, wherein the porogen precursor has a hydrocarbon structure having both amine and hydroxyl functional groups having the general formula $C_nH_{2n+2-2u-2v-w-2x-3y-z}(NH_2)_w(NH)_x(N)_y(OH)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of hydroxyl groups in the structure and is between 1 and 4, and where the hydroxyl and/or amine groups can be exo- and/or endocyclic.

39. The method of claim 13, wherein the porogen precursor has a hydrocarbon structure having at least one amine functional group and ether linkage and having the general formula $C_nH_{2n+2-2u-2v-w-2x-3y-z}(NH_2)_w(NH)_x(N)_y(O)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of ether linkages in the structure and is between 1 and 4, and where the ether linkage(s) and/or amine groups can be exo- and/or endocyclic.

40. The method of claim 1 wherein the precursor mixture further comprises a porogenated precursor.

41. The method of claim 40, wherein the porogenated precursor is a member selected from the group consisting of 1-neohexyl-1,3,5,7-tetramethylcyclotetrasiloxane, 1-neopentyl-1,3,5,7-tetramethylcyclotetrasiloxane, neopentyldiethoxysilane, neohexyldiethoxysilane, neohexyltriethoxysilane, neopentyltriethoxysilane and neopentyl-di-t-butoxysilane.

42. A porous organosilicate glass film produced by the method of claim 1, said porous organosilicate glass film consisting of a material represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, wherein the film has pores and a dielectric constant less than 2.6.

43. The porous organosilicate glass film of claim 42, wherein v is from 20 to 30 atomic %, w is from 20 to 45 atomic %, x is from 5 to 25 atomic %, y is from 15 to 40 atomic % and z is 0.

44. The porous organosilicate glass film of claim 42, wherein z is 0.5 to 7 atomic % and substantially all F in the porous film is bonded to Si in Si—F groups.

45. The porous organosilicate glass film of claim 42, wherein 50% or greater of hydrogen contained therein is bonded to carbon.

46. A composition comprising:
(a) at least one organosilane and/or organosiloxane precursor having structure according to a formula selected from the group consisting of:
1) the formula $SiR^1_n(OR^2)_p(O(O)CR^3)_{4-(n+p)}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3, provided there is at least one Si—H bond in the structure;
2) the formula $R^1_n(OR^2)_p(O(O)CR^4)_{3-n-p}Si-OSiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, n+m≧1, n+p≦3, and m+q≦3, provided there is at least one Si—H bond in the structure;
3) the formula $R^1_n(OR^2)_p(O(O)CR^4)_{3-n-p}Si-SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, n+m+≧1, n+p≦3 and m+q≦3, provided there is at least one Si—H bond in the structure;
4) the formula $R^1_n(OR^2)_p(O(O)CR^4)_{3-n-p}Si-R^7-SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, $R^7$ is $C_2$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, and n+m≧1, and n+p≦3, and m+q≦3, provided there is at least one Si—H bond in the structure;
5) the formula $(R^1_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, and n+p≦4, provided there is at least one Si—H bond in the structure;
6) the formula $(R^1_n(OR^2)_p(O(O)CR^3)_{4-(n+p)}Si)_tNH_{3-t}$, where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, and n+p≦4, provided there is at least one Si—H bond in the structure;
7) the formula $(N(R^1)Si(R^1R^2))_x$, where $R^1$ and $R^2$ are independently H, $C_1$ to $C_4$, linear or branched, saturated, singly or multiply unsaturated, cyclic, partially or fully fluorinated, and x may be any integer from 2 to 8;
8) the formula $(C(R^1R^2)Si(R^1R^2))_x$, where $R^1$ and $R^2$ are independently H, $C_1$ to $C_4$, linear or branched, saturated, singly or multiply unsaturated, cyclic, partially or fully fluorinated, and x may be any integer from 2 to 8, provided there is at least one Si—H bond in the structure;
9) and mixtures thereof;
(b) a porogen, distinct from the at least one organosilane and/or organosiloxane precursor, and having a structure according to a formula selected from the group consisting of:
1) the formula $C_nH_{2n+2-2x-2y-z}(OH)_z$ where n=1-12, and where x is the number of cyclic rings in the structure and is between 0 and 4, and where y is the number of unsaturated bonds in the structure and is between 0 and n, and where z is the number of alcohol groups in the structure and is between 1 and 4, and where the hydroxyl group can be exo- and/or endocyclic;

2) the formula $C_nH_{2n+2-2x-2y}O_z$ where n=1-12, and where x is the number of cyclic rings in the structure and is between 0 and 4, and where y is the number of unsaturated bonds in the structure and is between 0 and n, and where z is the number of ether linkages in the structure and is between 1 and 4, and where the ether linkage(s) can be exo- and/or endocyclic;

3) the formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of epoxide groups in the structure and is between 1 and 4, and where the epoxide groups can be attached to a cyclic ring or a linear chain;

4) the formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4;

5) the formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4, and where the ketone group(s) can be exo- and/or endocyclic;

6) the formula $C_nH_{2n+2-2x-2y-3z}(OOH)_z$ where n=1-12, and where x is the number of cyclic rings in the structure and is between 0 and 4, and where y is the number of unsaturated bonds in the structure and is between 0 and n, and where z is the number of carboxylic acid groups in the structure and is between 1 and 4;

7) the formula $C_nH_{2n+2-2x-2y-6z}(O_3)_z$ where n=1-12, and where x is the number of cyclic rings in the structure and is between 0 and 4, and where y is the number of unsaturated bonds in the structure and is between 0 and n, and where z is the number of anhydride groups in the structure and is 1 or 2;

8) the formula $C_nH_{2n+2-2x-2y-2z}(O_2)_z$ where n=1-12, and where x is the number of cyclic rings in the structure and is between 0 and 4, and where y is the number of unsaturated bonds in the structure, and where none of the unsaturated bonds are conjugated with the carbonyl group of the ester, and where z is the number of anhydride groups in the structure and is 1 or 2;

9) the formula $C_nH_{2n+2-2x-2y-2z}(O_2)_z$ where n=1-12, and where x is the number of cyclic rings in the structure and is between 0 and 4, and where y is the number of unsaturated bonds in the structure and is greater than or equal to 1, and where at least of the unsaturated bonds are conjugated with the carbonyl group of the an ester, and where z is the number of ester groups in the structure and is 1 or 2;

10) the formula $C_nH_{2n+2-2u-2v-w-2y-3z}(OH)_w(O)_x(O)_y(OOH)_z$ where n=1-12, and where u is the number of cyclic rings in the structure and is between 0 and 4, and where v is the number of unsaturated bonds in the structure and is between 0 and n, and where w is the number of alcohol groups in the structure and is between 0 and 4, and where x is the number of ether linkages in the structure and is between 0 and 4 and where the ether linkage(s) can be endocyclic or exocyclic, and where y is the number of carbonyl groups in the structure and is between 0 and 3 in which the carbonyl group can be ketones and/or aldehydes, and where z is the number of carboxylic acid groups in the structure and is between 0 and 2;

11) the formula $C_nH_{2n+2-2x-2y-z}(NH_2)_z$ where n=1-12, and where x is the number of cyclic rings in the structure and is between 0 and 4, and where y is the number of unsaturated bonds in the structure and is between 0 and n, and where z is the number of primary amine groups in the structure and is between 1 and 4, and where the primary amine groups can be exo- and/or endocyclic;

12) the formula $C_nH_{2n+2-2x-2y-2z}(NH)_z$ where n=1-12, and where x is the number of cyclic rings in the structure and is between 0 and 4, and where y is the number of unsaturated bonds in the structure and is between 0 and n, and where z is the number of secondary amine groups in the structure and is between 1 and 4, and where the secondary amine groups can be exo- and/or endocyclic;

13) the formula $C_nH_{2n+2-2x-2y-3z}(N)_z$ where n=1-12, and where x is the number of cyclic rings in the structure and is between 0 and 4, and where y is the number of unsaturated bonds in the structure and is between 0 and n, and where z is the number of tertiary amine groups in the structure and is between 1 and 4, and where the tertiary amine groups can be exo- and/or endocyclic;

14) the formula $C_nH_{2n+2-2x-2y-z}(NO_2)_z$ where n=1-12, and where x is the number of cyclic rings in the structure and is between 0 and 4, and where y is the number of unsaturated bonds in the structure and is between 0 and n, and where z is the number of nitro groups in the structure and is between 1 and 4, and where the nitro groups can be exo- and/or endocyclic;

15) the formula $C_nH_{2n+2-2u-2v-w-2x-3y-z}(NH_2)_w(NH)_x(N)_y(OH)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of alcohol groups in the structure and is between 1 and 4, and where the alcohol and/or amine groups can be exo- and/or endocyclic;

16) the formula $C_nH_{2n+2-2u-2v-w-2x-3y-z}(NH_2)_w(NH)_x(N)_y(OH)_z$ where n=1-12, and where u is the number of cyclic rings in the structure and is between 0 and 4, and where v is the number of unsaturated bonds in the structure and is between 0 and n, and where w is the number of primary amine groups, x is the number of secondary amine groups, y is the number of ternary amine groups, and where 1<w+x+y<4, and where z is the number of ether linkages in the structure and is between 1 and 4, and where the ether linkages and/or amine groups can be exo- and/or endocyclic;

17) and mixtures thereof.

47. The composition of claim 46 further comprising:
(c) a porogenated precursor having a structure according to a formula selected from the group consisting of:
1) the formula $R^1{}_n(OR^2)_p(O(O)CR^3)_{4-(n+p)}Si$ where $R^1$ is independently H or $C_1$ to $C_{12}$ linear or branched, saturated, singly or multiply unsaturated, cyclic, partially or fully fluorinated hydrocarbon; $R^2$ and $R^3$ are independently $C_1$ to $C_{12}$ linear or branched, saturated, singly or multiply unsaturated, cyclic, aromatic, partially or fully fluorinated hydrocarbon, n is 1 to 3 and p is 0 to 3, provided that n+p≦4, and that at least one of $R^1$ is substituted with a $C_3$ or larger hydrocarbon as the porogen;

2) the formula $R^1{}_n(OR^2)_p(O(O)CR^4)_{3-n-p}Si$—O—$SiR^3{}_m(O(O)CR^5)_q(OR^6)_{3-m-q}$ where $R^1$ and $R^3$ are independently H or $C_1$ to $C_{12}$ linear or branched, saturated, singly or multiply unsaturated, cyclic, partially or fully fluorinated hydrocarbon; $R^2$, $R^4$, $R^5$ and $R^6$ are independently $C_1$ to $C_{12}$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≧1, n+p≦3, m+q≦3, and at least one of $R^1$ and $R^3$ is substituted with a $C_3$ or larger hydrocarbon as the porogen;

3) the formula $R^1{}_n(OR^2)_p(O(O)CR^4)_{3-n-p}Si$—$SiR^3{}_m(O(O)CR^5)_q(OR^6)_{3-m-q}$ where $R^1$ and $R^3$ are independently H or $C_1$ to $C_{12}$ linear or branched, saturated, singly or multiply unsaturated, cyclic, partially or fully fluorinated hydrocarbon; $R^2$, $R^4$, $R^5$ and $R^6$ are independently $C_1$ to $C_{12}$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≧1, n+p≦3, m+q≦3, and at least one of $R^1$ and $R^3$ is substituted with a $C_3$ or larger hydrocarbon as the porogen;

4) the formula $R^1{}_n(OR^2)_p(O(O)CR^4)_{3-n-p}Si$—$R^7$—$SiR^3{}_m(O(O)CR^5)_q(OR^6)_{3-m-q}$ where $R^1$ and $R^3$ are independently H or $C_1$ to $C_{12}$ linear or branched, saturated, singly or multiply unsaturated, cyclic, partially or fully fluorinated hydrocarbon; $R^2$, $R^4$, $R^5$, $R^6$, and $R^7$ are independently $C_1$ to $C_{12}$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≧1, n+p≦3, m+q≦3, and at least one of $R^1$, $R^3$ and $R^7$ is substituted with a $C_3$ or larger hydrocarbon as the porogen;

5) the formula $(R^1{}_n(OR^2)_p(O(O)CR^3)_{4-(n+p)}Si)_tCH_{4-t}$ where $R^1$ is independently H or $C_1$ to $C_{12}$ linear or branched, saturated, singly or multiply unsaturated, cyclic, partially or fully fluorinated hydrocarbon; $R^2$ and $R^3$ are independently $C_1$ to $C_{12}$ linear or branched, saturated, singly or multiply unsaturated, cyclic, aromatic, partially or fully fluorinated hydrocarbon, n is 1 to 3, p is 0 to 3, and t is 2 to 4, provided that n+p≦4 and at least one of $R^1$ is substituted with a $C_3$ or larger hydrocarbon as the porogen;

6) the formula $(R^1{}_n(OR^2)_p(O(O)CR^3)_{4-(n+p)}Si)_tNH_{3-t}$ where $R^1$ is independently H or $C_1$ to $C_{12}$ linear or branched, saturated, singly or multiply unsaturated, cyclic, partially or fully fluorinated hydrocarbon; $R^2$ and $R^3$ are independently $C_1$ to $C_{12}$ linear or branched, saturated, singly or multiply unsaturated, cyclic, aromatic, partially or fully fluorinated hydrocarbon, n is 1 to 3, p is 0 to 3 and t is 1 to 3, provided that n+p≦4 and at least one of $R^1$ is substituted with a $C_3$ or larger hydrocarbon as the porogen;

7) cyclic siloxanes of the formula $(OSiR^1R^3)_x$, where $R^1$ and $R^3$ are independently H or $C_1$ to $C_{12}$ linear or branched, saturated, singly or multiply unsaturated, cyclic, partially or fully fluorinated hydrocarbon, and x is any integer from 2 to 8, provided that at least one of $R^1$ and $R^3$ is substituted with a $C_3$ or larger hydrocarbon as the porogen;

8) cyclic silazanes of the formula $(NR^1SiR^1R^3)_x$, where $R^1$ and $R^3$ are independently H or $C_1$ to $C_{12}$ linear or branched, saturated, singly or multiply unsaturated, cyclic, partially or fully fluorinated hydrocarbon, and x is any integer from 2 to 8, provided that at least one of $R^1$ and $R^3$ is substituted with a $C_3$ or larger hydrocarbon as the porogen;

9) cyclic carbosilanes of the formula $(CR^1R^3SiR^1R^3)_x$, where $R^1$ and $R^3$ are independently H or $C_1$ to $C_{12}$ linear or branched, saturated, singly or multiply unsaturated, cyclic, partially or fully fluorinated hydrocarbon, and x is any integer from 2 to 8, provided that at least one of $R^1$ and $R^3$ is substituted with a $C_3$ or larger hydrocarbon as the porogen; and 10) mixtures thereof.

48. The method of claim 1 wherein the removing step comprises treating the preliminary film with at least one post-treating agent selected from the group consisting of thermal energy, plasma energy, photon energy, electron energy, microwave energy and chemicals.

49. The method of claim 48, wherein the at least one post-treating agent improves a property of the resulting porous organosilicate glass film before, during and/or after removing substantially all of the porogen from the preliminary film.

50. The method of claim 48, wherein an additional post-treating agent removes at least a portion of the porogen from the preliminary film.

51. The method of claim 48, wherein the at least one post-treating agent is photon energy in the range of from 200 to 8000 nanometers.

52. The method of claim 48, wherein the at least one post-treating agent is electron energy provided by an electron beam.

53. The method of claim 48, wherein the at least one post-treating agent is a supercritical fluid.

54. The method of claim 1 wherein said hydrocarbon structure containing one or more ether linkages further contains at least one carbonyl functional group and having the general formula $C_nH_{2n+2-2w-2x-2y}(O)_y(O)_z$ where n=1-12, and where w is the number of cyclic rings in the structure and is between 0 and 4, and where x is the number of unsaturated bonds in the structure and is between 0 and n, and where y is the number of carbonyl groups in the structure in which the carbonyl group can be ketones and/or aldehydes, and where z is the number of ether linkages in the structure and is 1 or 2, and where the ether linkages can be endocyclic or exocyclic.

55. The method of claim 1 wherein said hydrocarbon structure containing one or more ether linkages further contains at least one alcohol functional group and having the general formula $C_nH_{2n+2-2w-2x-y}(OH)_y(O)_z$ where n=1-12, and where w is the number of cyclic rings in the structure and is between 0 and 4, and where x is the number of unsaturated bonds in the structure and is between 0 and n, and where y is the number of alcohol groups in the structure, and where z is the number of ether linkages in the structure and is 1 or 2, and where the ether linkage(s) can be endocyclic or exocyclic.

* * * * *

UNITED STATES PATENT AND TRADEMARK OFFICE
CERTIFICATE OF CORRECTION

PATENT NO. : 7,332,445 B2
APPLICATION NO. : 11/228223
DATED : February 19, 2008
INVENTOR(S) : Aaron S. Lukas et al.

It is certified that error appears in the above-identified patent and that said Letters Patent is hereby corrected as shown below:

Column 37, Line 9
In claim 1 delete the word "$C_nH_{2n+2-2x-2y-2z}(NH_2)_z$" and insert the word
-- $C_nH_{2n+2-2x-2y-z}(NH_2)_z$ --

Column 38, Line 11
In claim 1 delete the word "class" and insert the word -- glass --

Column 40, Line 23/24
In claim 22 delete the word "methyltri-methoxysilane" and insert the word
-- methyltriethoxysilane --

Column 40, Line 33
In claim 24 delete the word "alcohol" and insert the word -- hydroxyl --

Column 40, Line 39
In claim 24 delete the words "alcohol functionality"

Column 40, Line 53
In claim 26 delete the word "$H_{2n+2-2-x-2y-2z}O_z$" and insert the word
-- $H_{2n+2-2x-2y-2z}O_z$ --

Column 43, Line 42
In claim 46 delete the word "$R1_n(OR^2)_p(O(O)CR^4)_{3-n-p}Si\text{-}OSiR^3_m$" and insert the word
-- $R^1_n(OR^2)_p(O(O)CR^4)_{3-n-p}Si\text{-}O\text{-}SiR^3_m$ --

Column 45, Line 1
In claim 46 delete the word "alcohol" and insert the word -- hydroxyl --

Column 46, Line 54
In claim 46 delete the word "ternary" and insert the word -- tertiary --

UNITED STATES PATENT AND TRADEMARK OFFICE
CERTIFICATE OF CORRECTION

PATENT NO.       : 7,332,445 B2
APPLICATION NO.  : 11/228223
DATED            : February 19, 2008
INVENTOR(S)      : Aaron S. Lukas et al.

It is certified that error appears in the above-identified patent and that said Letters Patent is hereby corrected as shown below:

Column 47, Line 17
In claim 47 delete the word "$R1_n(OR^2)_p(O(O)CR^4)_{3-n-p}Si\text{-}SiR^3_m(O$" and insert the word
-- $R^1_n(OR^2)_p(O(O)CR^4)_{3-n-p}Si\text{-}SiR^3_m(O$ --

Column 47, Line 29
In claim 47 delete the word "$R1_n(OR^2)_p(O(O)CR^4)_{3-n-p}Si\text{-}R^7$" and insert the word
-- $R^1_n(OR^2)_p(O(O)CR^4)_{3-n-p}Si\text{-}R^7$ --

Signed and Sealed this

Sixteenth Day of September, 2008

JON W. DUDAS
*Director of the United States Patent and Trademark Office*